(12) United States Patent
Sugiyama et al.

(10) Patent No.: US 9,065,004 B2
(45) Date of Patent: Jun. 23, 2015

(54) SEMICONDUCTOR LIGHT EMITTING ELEMENT

(71) Applicant: Kabushiki Kaisha Toshiba, Minato-ku (JP)

(72) Inventors: Naoharu Sugiyama, Komatsu (JP); Shigeya Kimura, Yokohama (JP); Hisashi Yoshida, Koto-ku (JP); Toshiki Hikosaka, Kawasaki (JP); Jumpei Tajima, Koganei (JP); Hajime Nago, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/323,281

(22) Filed: Jul. 3, 2014

(65) Prior Publication Data
US 2015/0008391 A1  Jan. 8, 2015

(30) Foreign Application Priority Data
Jul. 8, 2013  (JP) .................................. 2013-143085

(51) Int. Cl.
H01L 33/12 (2010.01)
H01L 33/06 (2010.01)
H01L 33/14 (2010.01)
H01L 33/00 (2010.01)

(52) U.S. Cl.
CPC ................ *H01L 33/12* (2013.01); *H01L 33/06* (2013.01); *H01L 33/0025* (2013.01)

(58) Field of Classification Search
CPC ...... H01L 33/12; H01L 33/06; H01L 33/0025
USPC ..................... 257/13, 14, 76, 77, 94, 98, 103, 257/E29.024, E29.089, E33.008, E33.048; 438/22, 29, 46, 47, 478
See application file for complete search history.

(56) References Cited

U.S. PATENT DOCUMENTS

| 6,420,197 | B1 | 7/2002 | Ishida et al. | |
| 2009/0200538 | A1* | 8/2009 | Sasaki et al. | 257/14 |
| 2012/0058577 | A1* | 3/2012 | Yoshida et al. | 438/14 |
| 2013/0092901 | A1* | 4/2013 | Seo et al. | 257/13 |
| 2013/0105762 | A1* | 5/2013 | Kyono et al. | 257/13 |

(Continued)

FOREIGN PATENT DOCUMENTS

| JP | 2000-311863 | 11/2000 |
| JP | 2001-203384 | 7/2001 |

(Continued)

*Primary Examiner* — Dao H Nguyen
(74) *Attorney, Agent, or Firm* — Oblon, McClelland, Maier & Neustadt, L.L.P.

(57) ABSTRACT

In general, according to one embodiment, a semiconductor light emitting element includes: a first semiconductor layer; a second semiconductor layer; a light emitting layer. The light emitting layer includes a well layer with a thickness of t1 (nanometers). The well layer includes $In_xGa_{1-x}N$ having an In composition ratio x higher than 0 and lower than 1. The first semiconductor layer has a tensile strain of not less than 0.02 percent and not more than 0.25 percent in a plane perpendicular to a stacking direction. A peak wavelength λp (nanometers) of light satisfies a relationship of $\lambda p = a1 + a2 \times (x + (t1 - 3.0) \times a3)$. The a1 is not less than 359 and not more than 363. The a2 is not less than 534 and not more than 550. The a3 is not less than 0.0205 and not more than 0.0235.

20 Claims, 13 Drawing Sheets

(56) References Cited

U.S. PATENT DOCUMENTS

2014/0034902 A1* 2/2014 Hwang et al. .................. 257/13
2014/0045289 A1* 2/2014 Nago et al. ..................... 438/47

FOREIGN PATENT DOCUMENTS

| JP | 2008-78684 | 4/2008 |
| JP | 4760821 | 8/2011 |

* cited by examiner

SEMICONDUCTOR LIGHT EMITTING ELEMENT

CROSS-REFERENCE TO RELATED APPLICATIONS

This application is based upon and claims the benefit of priority from Japanese Patent Application No. 2013-143085, filed on Jul. 8, 2013; the entire contents of which are incorporated herein by reference.

FIELD

Embodiments described herein relate generally to a semiconductor light emitting element.

BACKGROUND

White light is obtained by combining a blue LED (light emitting diode) that emits blue light and a fluorescent substance of yellow, red, or the like, for example. Such white LEDs are used for illumination, and energy saving effect is expected.

A nitride semiconductor is used for the blue LED, and a quantum well structure of InGaN/GaN, for example, is used for the light emitting layer. Since the lattice constant of InGaN is different from the lattice constant of GaN, the quality of the InGaN crystal layer may be degraded and the light emission efficiency may be reduced, depending on the fabrication conditions of the quantum well structure of InGaN/GaN. It is desired to provide a semiconductor light emitting element with a high light emission efficiency.

DETAILED DESCRIPTION

Figure 1:
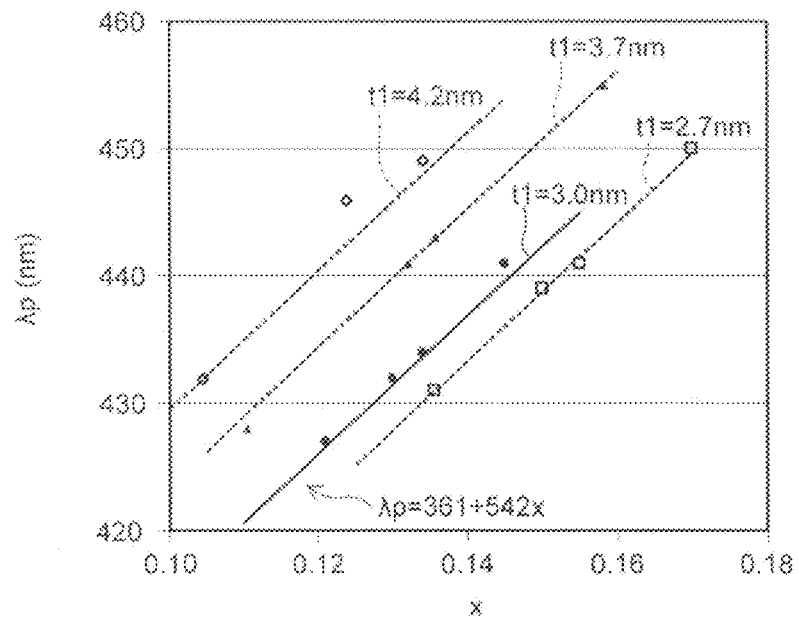
FIG. 1 is a graph illustrating characteristics of a semiconductor light emitting element according to an embodiment.

In general, according to one embodiment, a semiconductor light emitting element includes: a first semiconductor layer of a first conductivity type; a second semiconductor layer of a second conductivity type; a light emitting layer. The first semiconductor layer contains a nitride semiconductor crystal. The second semiconductor layer contains a nitride semiconductor crystal. The light emitting layer is provided between the first semiconductor layer and the second semiconductor layer and includes a well layer with a thickness of t1 (nanometers). The well layer includes $In_xGa_{1-x}N$ having an In composition ratio x higher than 0 and lower than 1. The first semiconductor layer has a tensile strain of not less than 0.02 percent and not more than 0.25 percent in a plane perpendicular to a stacking direction from the first semiconductor layer toward the second semiconductor layer. The second semiconductor layer has a tensile strain in the plane. A lattice constant of the well layer is larger than a lattice constant of the first semiconductor layer. A lattice constant of the well layer is larger than a lattice constant of the second semiconductor layer. A peak wavelength $\lambda p$ (nanometers) of light emitted from the light emitting layer satisfies a relationship of $\lambda p = a1 + a2 \times (x + (t1-3.0) \times a3)$. The a1 is not less than 359 and not more than 363. The a2 is not less than 534 and not more than 550. The a3 is not less than 0.0205 and not more than 0.0235.

Hereinbelow, embodiments of the invention are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

FIG. 1 is a graph illustrating characteristics of a semiconductor light emitting element according to an embodiment.

FIG. 1 illustrates characteristics of the semiconductor light emitting element.

Figure 2:
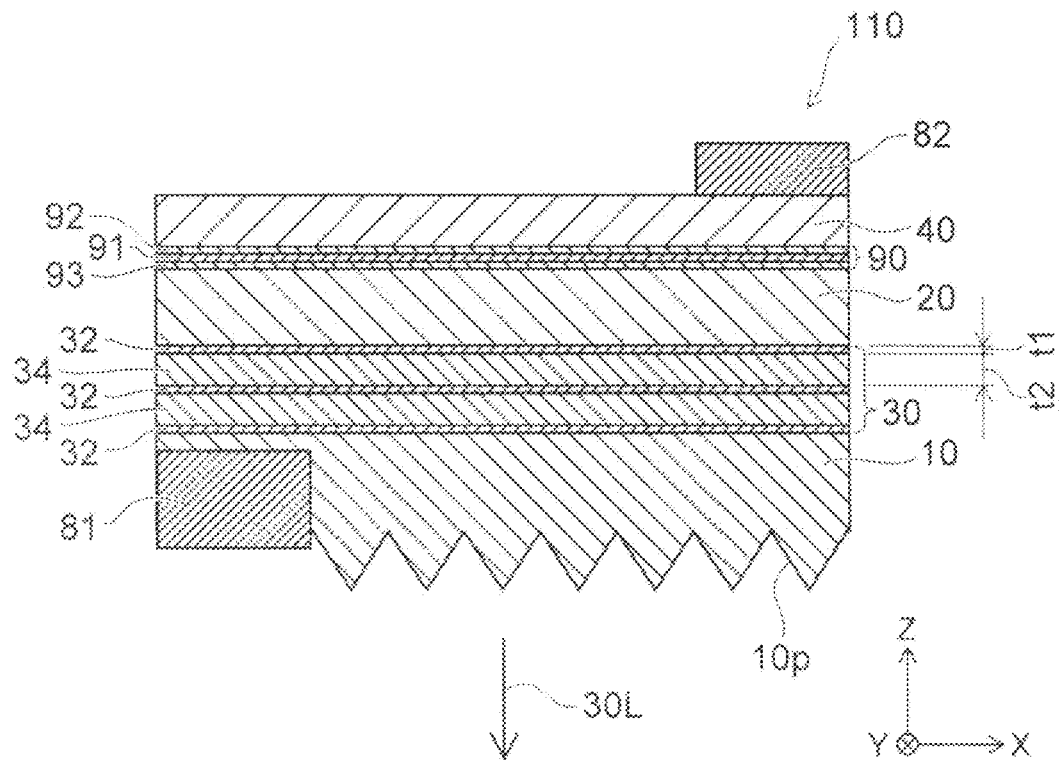
FIG. 2 is a schematic cross-sectional view illustrating a semiconductor light emitting element according to the embodiment.

FIG. 2 is a schematic cross-sectional view illustrating a semiconductor light emitting element according to the embodiment.

Figure 3:
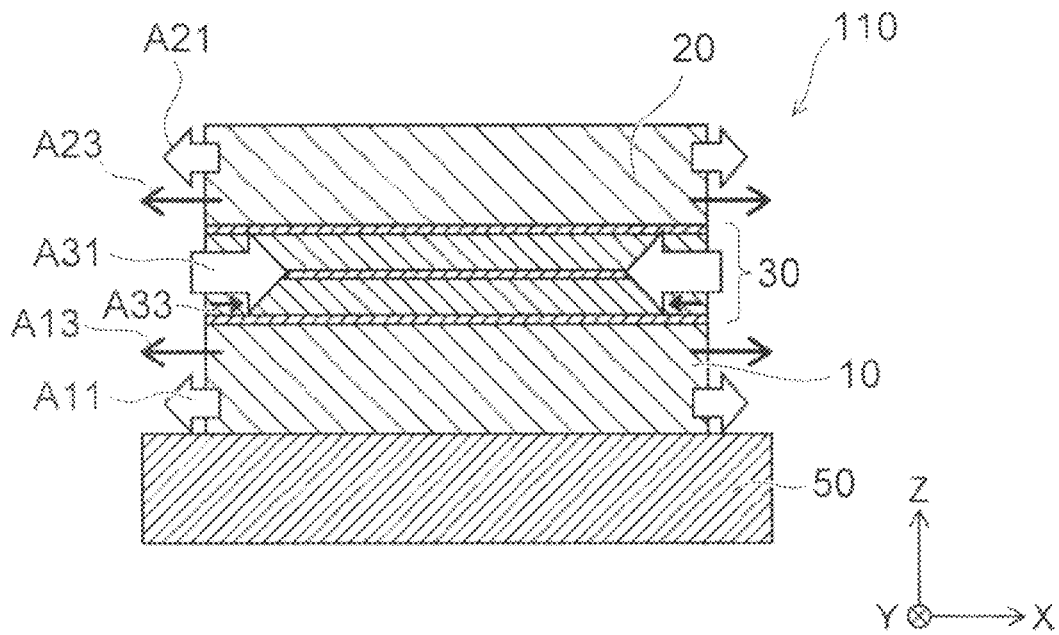
FIG. 3 is a schematic view illustrating the semiconductor light emitting element according to the embodiment.

FIG. 3 is a schematic view illustrating the semiconductor light emitting element according to the embodiment.

First, an example of the configuration of the semiconductor light emitting element is described with reference to FIG. 2.

As shown in FIG. 2, a semiconductor light emitting element 110 according to the embodiment includes a first semiconductor layer 10 of a first conductivity type, a second semiconductor layer 20 of a second conductivity type, and a light emitting layer 30. The light emitting layer 30 is provided between the first semiconductor light emitting layer 10 and the second semiconductor layer 20. The semiconductor light emitting element 110 is an LED, for example. The semiconductor light emitting element 110 may be a laser diode. In the following, a description is given on the assumption that the semiconductor light emitting element 110 is an LED.

The first conductivity type is the n-type, and the second conductivity type is the p-type, for example. The first conductivity type may be the p-type, and the second conductivity type may be the n-type. In the following, a description is given on the assumption that the first conductivity type is the n-type and the second conductivity type is the p-type.

The first semiconductor layer 10 and the second semiconductor layer 20 contain a nitride semiconductor crystal. The direction from the first semiconductor layer 10 toward the second semiconductor layer 20 is defined as the stacking direction. The stacking direction is defined as the Z-axis direction. One direction perpendicular to the Z-axis direction is defined as the X-axis direction. The direction perpendicular to the Z-axis direction and the X-axis direction is defined as the Y-axis direction.

An n-type GaN layer is used as the first semiconductor layer 10, for example. A p-type GaN layer is used as the second semiconductor layer 20, for example. The second semiconductor layer 20 may further include a p-type AlGaN layer. The second semiconductor layer 20 may include a plurality of AlGaN layers with different composition ratios. The first semiconductor layer 10 may further include an i-GaN layer for the sake of convenience, for example. An n-type GaN layer is disposed between the i-GaN layer and the light emitting layer 30. The impurity concentration in the i-GaN layer is lower than the impurity concentration in the n-type GaN layer. The i-GaN layer is a non-doped GaN layer, for example.

The light emitting layer 30 contains a nitride semiconductor crystal. The light emitting layer 30 includes a well layer 32 (a quantum well layer). The light emitting layer 30 has a single quantum well (SQW) structure or a multiple quantum well (MQW) structure, for example. In the SQW structure, the number of well layers 32 is one. In the MQW structure, the number of well layers 32 is two or more. The light emitting layer 30 further includes a barrier layer 34, for example. The well layer 32 is disposed between barrier layers 34. A plurality of barrier layers 34 and a plurality of well layers 32 are alternately arranged along the Z-axis direction, for example. The well layer 32 and the barrier layer 34 contain a nitride semiconductor crystal.

The band gap energy of the well layer 32 is smaller than the band gap energy of the barrier layer 34. The band gap energy of the well layer 32 is smaller than the band gap energy of the first semiconductor layer 10, and is smaller than the band gap energy of the second semiconductor layer 20.

InGaN is used for the well layer 32, for example. The well layer 32 includes a crystal layer of $In_xGa_{1-x}N$ ($0<x<1$). The In composition ratio x in the well layer 32 is higher than 0 and lower than 1. The lattice constant in the InGaN crystal of the well layer 32 is larger than the lattice constant of the first semiconductor layer 10 (for example, GaN). The lattice constant in the InGaN crystal of the well layer 32 is larger than the lattice constant of the second semiconductor layer 20 (for example, GaN).

The well layer 32 has a thickness along the Z-axis direction (a well layer thickness t1). The barrier layer 34 has a thickness along the Z-axis direction (a barrier layer thickness t2). The barrier layer thickness t2 is larger than the well layer thickness t1, for example. Thereby, the effect of confining carriers in the well layer 32 is enhanced, and a high light emission efficiency is easily obtained.

In this example, the semiconductor light emitting element 110 further includes a support substrate 40, a first electrode 81, a second electrode 82, and a conductive layer 90.

The second semiconductor layer 20 is disposed between the support substrate 40 and the light emitting layer 30. The conductive layer 90 is disposed between the support substrate 40 and the second semiconductor layer 20. The first electrode 81 is electrically connected to the first semiconductor layer 10. In this example, part of the first semiconductor layer 10 is disposed between part of the light emitting layer 30 and the first electrode 81. The second electrode 82 is electrically connected to the second semiconductor layer 20. In this example, part of the support substrate 40 is disposed between part of the conductive layer 90 and the second electrode 82. In this example, the second electrode 82 is electrically connected to the second semiconductor layer 20 via the support substrate 40 and the conductive layer 90. The second electrode 82 may be in contact with the conductive layer 90 without the support substrate 40 between them.

A conductive material (for example, a metal or a semiconductor) is used for the support substrate 40. A copper layer is used as the support substrate 40, for example. A plated metal layer may be used as the support substrate 40, for example. A silicon substrate (a semiconductor substrate) containing an impurity and the like may be used as the support substrate 40.

In this example, the conductive layer 90 includes a reflection metal layer 93, a first bonding metal layer 91, and a second bonding metal layer 92. The first bonding metal layer 91 is disposed between the second bonding metal layer 92 and the second semiconductor layer 20. The reflection metal layer 93 is disposed between the first bonding metal layer 91 and the second semiconductor layer 20.

A Ag layer or an alloy layer containing Ag is used as the reflection metal layer 93, for example. AuSn alloy or the like is used for at least one of the first bonding layer 91 and the second bonding metal layer 92, for example. The reflection metal layer 93 is provided on a surface of the second semiconductor layer 20, for example. The first bonding metal layer 91 is provided on a surface of the reflection metal layer 93. On the other hand, the second bonding metal layer 92 is provided on a surface of the support substrate 40 of copper or the like, for example. By bonding the first bonding metal layer 91 and the second bonding metal layer 92, the second electrode 82 and the second semiconductor layer 20 are electrically connected. The semiconductor light emitting element 110 in this example is a thin film LED, for example.

By applying a voltage between the first electrode 81 and the second electrode 82, a current is supplied to the light emitting layer 30 via the first semiconductor layer 10 and the second semiconductor layer 20. Thereby, light 30L is emitted from the light emitting layer 30. In this example, the light 30L is emitted from the first semiconductor layer 10 side to the outside. In this example, a surface of the first semiconductor layer 10 (a surface on the opposite side to the light emitting layer 30) is provided with unevenness 10 p. By providing the unevenness 10 p, the extraction efficiency of light 30L is enhanced.

The thermal conductivity of the support substrate 40 is higher than the thermal conductivity of the stacked body including the first semiconductor layer 10, the second semiconductor layer 20, and the light emitting layer 30. Thereby, heat can be dissipated with good efficiency, and a high light emission efficiency can be obtained.

The stacked body including the first semiconductor layer 10, the light emitting layer 30, and the second semiconductor layer 20 is formed by epitaxial growth on a growth substrate, for example. The growth is performed at high temperature; and when the temperature is returned to room temperature after the growth, stress may be applied to the stacked body due to the difference in thermal expansion coefficient between the stacked body and the growth substrate, for example. In addition, stress may be applied to the stacked body due to the difference in lattice constant between the crystal of the growth substrate and the crystal of the stacked body. In addition, stress may be applied to the stacked body from a strain adjustment layer that applies a stress to the stacked body. Thus, by a stress being applied to the stacked body, a strain occurs in the stacked body.

In the embodiment, the first semiconductor layer 10 has a strain.

FIG. 3 illustrates strain and stress in the semiconductor crystal layers of the semiconductor light emitting element 110.

In this example, for easier description, a state where the stacked body including the first semiconductor layer 10, the light emitting layer 30, and the second semiconductor layer 20 is provided on a growth substrate 50 is described. For example, the first semiconductor layer 10, the light emitting layer 30, and the second semiconductor layer 20 are grown in this order on the growth substrate 50.

As shown in FIG. 3, the first semiconductor layer 10 has a tensile strain A13. The tensile strain is a strain in the X-Y plane. The tensile strain is generated by a tensile stress A11 being applied to the first semiconductor layer 10, for example. Also the tensile stress is a stress in the X-Y plane. By the tensile stress being applied from the growth substrate 50 to the first semiconductor layer 10, the tensile strain mentioned above is generated, for example.

On the other hand, the light emitting layer 30 receives a compressive stress A31. As described above, the lattice constant in the InGaN crystal of the well layer 32 is larger than the lattice constant of the first semiconductor layer 10 (for example, GaN). Thereby, the compressive stress A31 in the light emitting layer 30 is generated.

On the other hand, the second semiconductor layer 20 has a tensile strain A23, for example. The tensile strain is a strain in the X-Y plane. The tensile strain is generated by a tensile stress A21 being applied to the second semiconductor layer 20, for example. Also the tensile stress is a stress in the X-Y plane.

Thus, in the semiconductor light emitting element 110 according to the embodiment, the first semiconductor layer 10 has a tensile strain in the in-plane direction (elastic expansion and contraction of the lattice spacing). That is, the first semiconductor layer 10 has the tensile strain A13 in a plane (the X-Y plane) perpendicular to the stacking direction (the Z-axis direction). The tensile strain A13 is generated due to the tensile stress A11 that the first semiconductor layer 10 receives from the outside (for example, the static force applied to the crystal), for example. In the specification of this application, the in-plane direction is a direction in a plane perpendicular to the stacking direction.

The lattice length in the in-plane direction of the first semiconductor layer 10 (the lattice spacing in the actual crystal lattice) is longer than the lattice constant of the first semiconductor layer 10, for example.

In the specification of this application, the lattice constant is the lattice spacing in a state where no stress is applied to the layer, and is a value determined as a physical constant. When a crystal layer has a tensile strain, the lattice length of the crystal layer is longer than the lattice constant (the lattice length when there is no strain). Conversely, when a crystal layer has a compressive strain, the lattice length of the crystal layer is shorter than the lattice constant (the lattice length when there is no strain).

On the other hand, the nitride semiconductor crystal contained in the light emitting layer 30 has a lattice constant larger than the lattice length in the plane of the first semiconductor layer 10. The well layer 32 has a compressive strain A33 (elastic expansion and contraction of the lattice spacing) as a result of receiving the compressive stress A31 from the first semiconductor layer 10. That is, the lattice length in the in-plane direction of the well layer 32 is smaller than the lattice constant in the in-plane direction of the well layer 32.

In the light emitting layer 30, the average lattice constant can be defined. The average lattice constant is the lattice constant that is the average weighted by thickness distribution of the lattice constant of the barrier layer 34 and the lattice constant of the well layer 32. The average lattice constant of the light emitting layer 30 is larger than the lattice constant of the first semiconductor layer 10. The average lattice constant of the light emitting layer 30 is larger than the lattice length in the in-plane direction of the first semiconductor layer 10 expanded in the in-plane direction by receiving a tensile stress.

In the embodiment, the crystal orientation of the nitride semiconductor crystal layer is arbitrary. For example, the crystal orientation (the c-axis) in the stacked body including the first semiconductor layer 10, the light emitting layer 30, and the second semiconductor layer 20 is substantially parallel to the Z-axis direction. The (0001) plane is parallel to the Z-axis direction, for example. In this case, the lattice constant in the in-plane direction is the lattice spacing in the a-axis direction (the lattice spacing when there is no strain), for example. The lattice length in the in-plane direction is the lattice spacing in the a-axis direction, for example.

FIG. 1 illustrates characteristics of the semiconductor light emitting element 110.

FIG. 1 illustrates the experimental results on the relationship between the In composition ratio x of the well layer 32 in the semiconductor light emitting element 110 and the peak wavelength λp (nanometers, nm) of the light emitted from the light emitting layer 30 (the light 30L). The intensity of the emitted light from the light emitting layer 30 shows a maximum at the peak wavelength λp. In this example, the tensile strain that the first semiconductor layer 10 has is approximately 0.13% (not less than 0.12% and not more than 0.14%). The horizontal axis of FIG. 1 is the In composition ratio x. The vertical axis is the wavelength λp (nm). The conditions of the experiment shown in FIG. 1 and the method for finding the values are described later.

In this example, the thickness of the well layer 32 (the well layer thickness t1) is changed between 2.7 nm, 3.0 nm, 3.7 nm, and 4.2 nm.

As can be seen from FIG. 1, at each well layer thickness t1, the peak wavelength λp of light changes substantially linearly with respect to the In composition ratio x. In this example, it is approximated that the relationship between the In composition ratio x and the peak wavelength λp is invariant when the tensile strain is not less than 0.12% and not more than 0.14%.

When the well layer thickness t1 is 3.0 nm, the peak wavelength λp (nm) is substantially expressed by Formula 1 below, for example.

$$\lambda p = 361 + 542 \times x \tag{1}$$

As can be seen from FIG. 1, when the well layer thickness t1 is changed, the peak wavelength λp shifts. When the case of the well layer thickness t1 being 3.0 nm is taken as a reference, the peak wavelength λp (nm) is expressed by Formula 2 below, using the well layer thickness t1 (nm) and the In composition ratio x.

$$\lambda p = a1 + a2 \times (x + (t1 - 3.0) \times a3) \quad (2)$$

where a1, a2, and a3 are constants.

In the example shown in FIG. 1, the constant a1 is 361±2, considering errors. That is, the constant a1 is not less than 359 and not more than 363. The constant a2 is 542±8. That is, the constant a2 is not less than 534 and not more than 550. The constant a3 is 0.022±0.0015. That is, the constant a3 is not less than 0.0205 and not more than 0.0235.

Thus, in the semiconductor light emitting element 110 according to the embodiment, the well layer thickness t1, the In composition ratio x of the well layer 32, and the peak wavelength λp of light emission satisfy the relationship of Formula 2 above. Formula 2 is a relationship found by the inventors of this application.

The relationship of Formula 2 is obtained when the first semiconductor layer 10 has a tensile strain in the in-plane direction (a direction in the X-Y plane perpendicular to the Z-axis direction) and the second semiconductor layer 20 has a tensile strain in the in-plane direction in the embodiment.

A reference example will now be described in which these semiconductor layers have not a tensile strain but a compressive strain.

Figure 4:
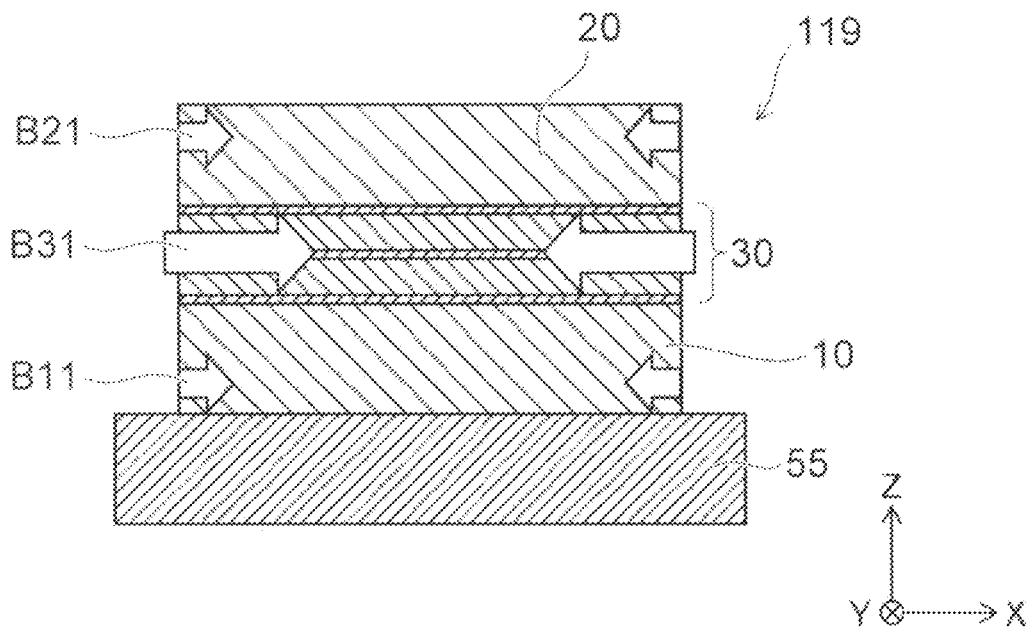
FIG. 4 is a schematic view illustrating a semiconductor light emitting element of the reference example.

FIG. 4 is a schematic view illustrating a semiconductor light emitting element of the reference example.

As shown in FIG. 4, also in a semiconductor light emitting element 119 of the reference example, the first semiconductor layer 10, the light emitting layer 30, and the second semiconductor layer 20 are provided. In the semiconductor light emitting element 119, unlike the semiconductor light emitting element 110, the first semiconductor layer 10 has a compressive strain in the in-plane direction, and the second semiconductor layer 20 has a compressive strain in the in-plane direction.

In the reference example, the first semiconductor layer 10 receives a compressive stress B11, for example. The compressive stress is strong. Thereby, the first semiconductor layer 10 has a compressive strain. On the other hand, also in this case, the lattice constant in the InGaN crystal of the well layer 32 is larger than the lattice constant of the first semiconductor layer 10 (for example, GaN). Therefore, a compressive stress B31 in the light emitting layer 30 is generated. In the reference example, since the first semiconductor layer 10 receives the compressive stress B11, the compressive stress B31 that the light emitting layer 30 receives is very large. On the other hand, in the reference example, the second semiconductor layer 20 receives a compressive strain B21.

Thus, in the semiconductor light emitting element 119 of the reference example, the first semiconductor layer 10 and the second semiconductor layer 20 receive a compressive stress in the in-plane direction, and have a compressive strain in the in-plane direction. Consequently, the compressive stress that the light emitting layer 30 receives is very large.

In contrast, as described in regard to FIG. 3, in the semiconductor light emitting element 110 according to the embodiment, the first semiconductor layer 10 and the second semiconductor layer 20 receive a tensile stress in the in-plane direction, and have a tensile strain in the in-plane direction. Consequently, the compressive stress that the light emitting layer 30 receives is small as compared to the reference example.

Thus, in the semiconductor light emitting element 110 according to the embodiment, a tensile stress in the in-plane direction is applied to the first semiconductor layer 10 and the second semiconductor layer 20. This stress is the stress applied from the growth substrate 50, for example, as described above. When a silicon substrate is used as the growth substrate 50, a tensile stress like the above may be formed due to the difference in thermal expansion coefficient between the silicon and the nitride semiconductor, for example. On the other hand, when a sapphire substrate, for example, is used as a substrate 55 of the semiconductor light emitting element 119, a compressive stress like the above is formed.

In the semiconductor light emitting element 119 in which the direction of stress is thus different from that of the semiconductor light emitting element 110, light emission characteristics different from those of the semiconductor light emitting element 110 are obtained.

Figure 5:
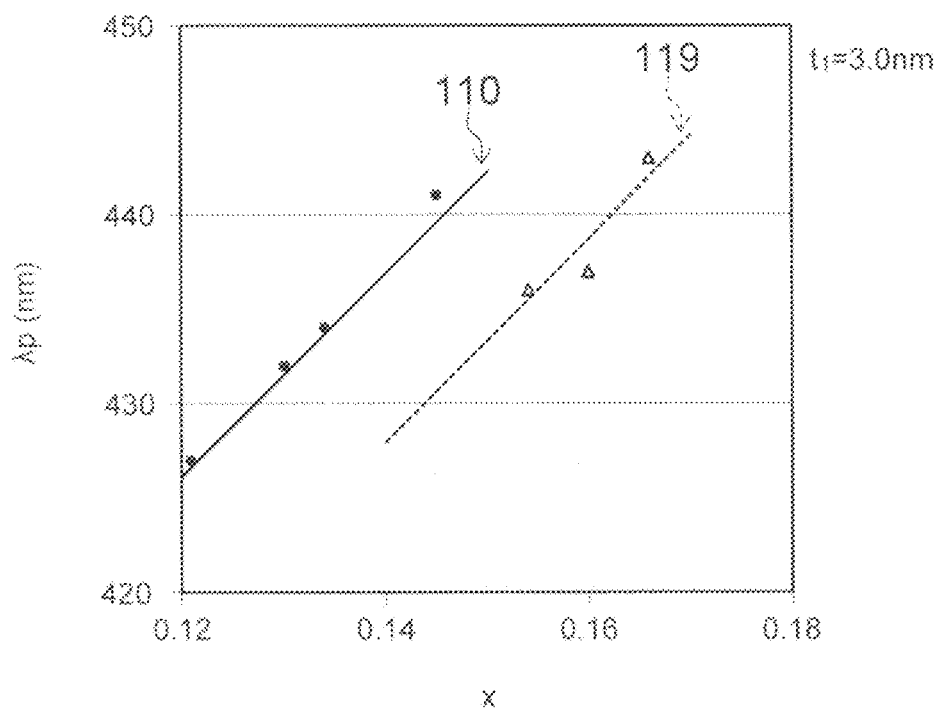
FIG. 5 is a graph illustrating characteristics of semiconductor light emitting elements.

FIG. 5 is a graph illustrating characteristics of semiconductor light emitting elements.

FIG. 5 illustrates the experimental results of the relationship between the In composition ratio x in the well layer 32 and the peak wavelength λp for the semiconductor light emitting elements 110 and 119 mentioned above. In this example, the well layer thickness t1 is 3.0 nm. The characteristics of the semiconductor light emitting element 110 shown in FIG. 5 correspond to part of the characteristics when the well layer thickness t1 in FIG. 1 is 3.0 nm. In the semiconductor light emitting element 119, a compressive stress of approximately 0.15% is applied to the first semiconductor layer 10.

As shown in FIG. 5, at the same value of the In composition ratio x, the peak wavelength λp in the semiconductor light emitting element 119 of the reference example is shorter than the peak wavelength λp in the semiconductor light emitting element 110 according to the embodiment. In other words, the In composition ratio x at which the same peak wavelength λp is provided is lower in the semiconductor light emitting element 110 than in the semiconductor light emitting element 119.

Thus, in the semiconductor light emitting element 119 of the reference example, different relationships from Formula 1 and Formula 2 above occur. In the embodiment, a desired peak wavelength λp is obtained by an In composition ratio x lower than that of the reference example.

For example, to obtain a peak wavelength λp of 440 nm, the In composition ratio x is 0.145 in the semiconductor light emitting element 110. In contrast, the In composition ratio x is approximately 0.162 in the semiconductor light emitting element 119.

In the case where the light emitting layer 30 is configured so as to obtain a peak wavelength substantially equal to a prescribed peak wavelength λp, the In composition ratio x is lower than the In composition ratio of a well layer in which the lattice length is substantially equal to the lattice constant. Thus, high crystallinity is obtained by setting the In composition ratio x for obtaining a peak wavelength λp of the objective to a low value. Thereby, a high light emission efficiency is obtained.

Examples of the characteristics of the semiconductor light emitting element will now be described.

When the well layer thickness t1 is reduced, the effect of confining carriers is increased. Consequently, the region where the distribution of electrons and the distribution of holes overlap (overlap integral) is increased. Thereby, the light emission efficiency is improved.

However, when the well layer thickness t1 is reduced, the peak wavelength λp of light emission shifts.

Figure 6A:
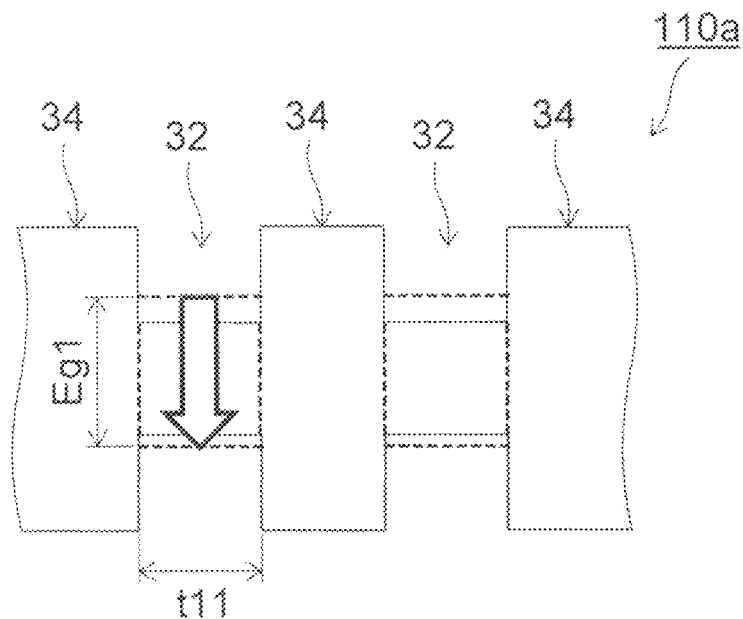
FIG. 6A and FIG. 6B are schematic diagrams illustrating the band gap energy of semiconductor light emitting elements.
Figure 6B:
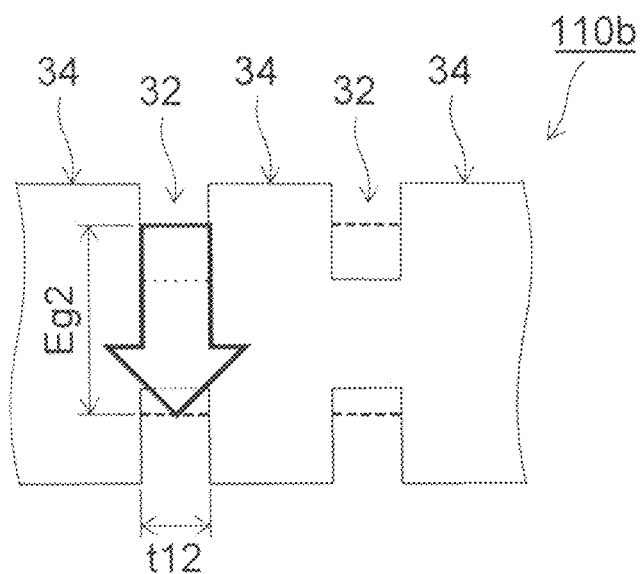

FIG. 6A and FIG. 6B are schematic diagrams illustrating the band gap energy of semiconductor light emitting elements.

In a semiconductor light emitting element 110a illustrated in FIG. 6A, the well layer 32 has a well layer thickness t11. In a semiconductor light emitting element 110b illustrated in FIG. 6B, the well layer 32 has a well layer thickness t12. The well layer thickness t12 of the semiconductor light emitting element 110b is smaller than the well layer thickness t11 of the semiconductor light emitting element 110a (that is, t11>t12).

As illustrated in FIG. 6A and FIG. 6B, when the well layer thickness t1 is reduced, the quantum level is raised, and equivalently the band gap energy is increased (that is, Eg1<Eg2). When the equivalent band gap energy in the well layer 32 is increased, the peak wavelength $\lambda p$ of light emission becomes shorter. Thus, when the well layer thickness t1 is reduced at the same In composition ratio x, the peak wavelength $\lambda p$ of light emission becomes shorter.

Hence, to obtain a desired peak wavelength $\lambda p$ while reducing the well layer thickness t1, it is attempted to increase the In composition ratio x of the well layer 32. However, if the In composition ratio x is increased, crystallinity is likely to be degraded. Consequently, the light emission efficiency cannot be enhanced sufficiently.

The inventors of this application has focused on the fact that the relationship between the In composition ratio x and the peak wavelength $\lambda p$ changes with the stress (strain) applied to the semiconductor crystal layer, as illustrated in FIG. 5. In the embodiment, by providing the semiconductor crystal layer with a tensile strain in the in-plane direction, the In composition ratio x for obtaining a peak wavelength $\lambda p$ of the objective can be reduced. Thereby, the degradation of crystallinity is suppressed, and light of a desired peak wavelength $\lambda p$ is obtained at high efficiency.

Figure 7A:
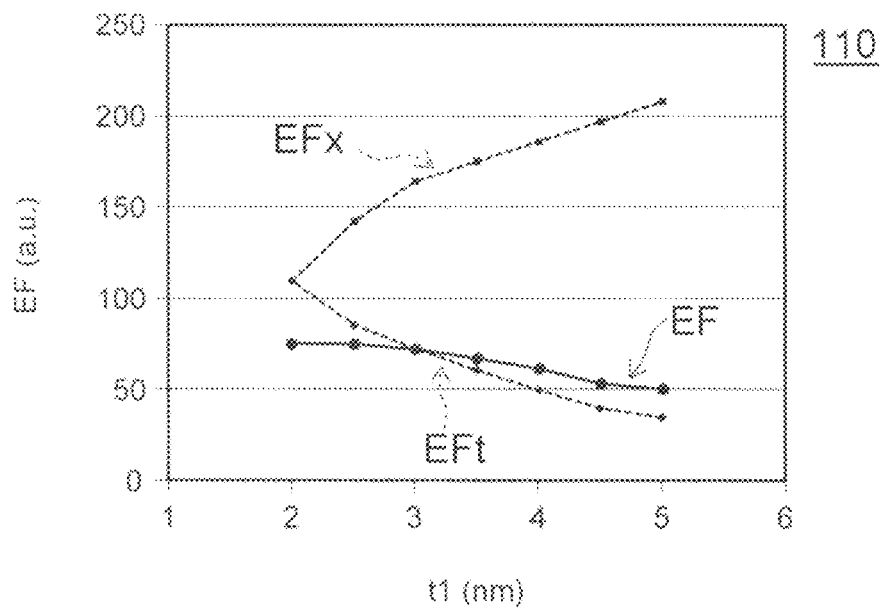
FIG. 7A and FIG. 7B are graphs illustrating characteristics of semiconductor light emitting elements.
Figure 7B:
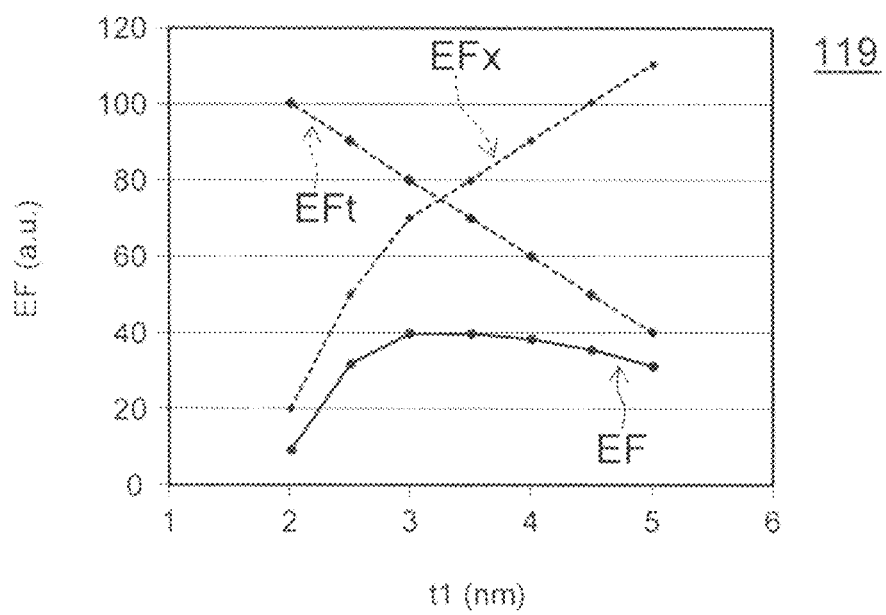

FIG. 7A and FIG. 7B are graphs illustrating characteristics of semiconductor light emitting elements.

FIG. 7A illustrates characteristics of the semiconductor light emitting element 110 in which a tensile stress is applied to the semiconductor crystal layer. FIG. 7B illustrates characteristics of the semiconductor light emitting element 119 in which a compressive stress is applied to the semiconductor crystal layer. The horizontal axis of the drawings is the well layer thickness t1. The vertical axis is the light emission efficiency EF (an arbitrary unit). The drawings illustrate the efficiency EFt resulting from the thickness of the well layer 32 and the efficiency EFx resulting from the In composition ratio x in the well layer 32. The drawings illustrate characteristics when the peak wavelength $\lambda p$ of light emission is fixed. In this example, the peak wavelength $\lambda p$ is 440 nm.

As can be seen from FIG. 7B, in the semiconductor light emitting element 119 in which a compressive stress is applied, the efficiency EFt resulting from the thickness of the well layer 32 decreases as the well layer thickness t1 increases. This is because when the well layer thickness t1 is increased, the effect of confining carriers is reduced, for example. On the other hand, the efficiency EFx resulting from the In composition ratio x increases as the well layer thickness t1 increases. This is because when the well layer thickness t1 is increased, the equivalent band gap energy Eg is reduced, and in order to compensate this the In composition ratio x is reduced, which results in increased crystallinity, for example. The actual efficiency EF is obtained through the effect of the efficiency EFt and the effect of the efficiency EFx combined together.

As can be seen from FIG. 7B, there is a trade-off between the efficiency EFt resulting from the thickness of the well layer 32 and the efficiency EFx resulting from the In composition ratio x. Therefore, the efficiency EF is at the maximum when the well layer thickness t is a certain value. In this example, the efficiency EF is at the maximum when the well layer thickness t1 is approximately 3.2 nm (not less than 3.0 nm and not more than 3.5 nm). The maximum value of the efficiency EF is approximately 40 (the arbitrary unit).

On the other hand, as can be seen from FIG. 7A, also in the semiconductor light emitting element 110 in which a tensile stress is applied, the efficiency EFt resulting from the thickness of the well layer 32 decreases as the well layer thickness t1 increases. The efficiency EFx resulting from the In composition ratio x increases as the well layer thickness t1 increases. At this time, in the semiconductor light emitting element 110, the well layer thickness t1 at which the highest efficiency EF is obtained is smaller than in the semiconductor light emitting element 119. In this example, the efficiency EF is at the maximum when the well layer thickness t1 is approximately 2.2 nm (not less than 2.0 nm and not more than 2.5 nm). The maximum value of the efficiency EF is approximately 75 (the arbitrary unit). Thus, in the semiconductor light emitting element 110, a higher efficiency EF is obtained than in the semiconductor light emitting element 119.

A higher efficiency EF being thus obtained in the semiconductor light emitting element 110 than in the semiconductor light emitting element 119 is due to the fact that the well layer thickness t1 at which that efficiency EF is obtained is smaller. This is because the relationship between the In composition ratio x and the peak wavelength $\lambda p$ is different between the semiconductor light emitting element 110 and the semiconductor light emitting element 119, as illustrated in FIG. 5.

That is, in the semiconductor light emitting element 110 according to the embodiment, the first semiconductor layer 10 and the second semiconductor layer 20 have an in-plane tensile stress. Thereby, a relationship between the In composition ratio x and the peak wavelength $\lambda p$ different from that in the case where a compressive strain is provided (the semiconductor light emitting element 119) is obtained. Specifically, in the case where the light emitting layer 30 is configured so as to obtain a peak wavelength substantially equal to a prescribed peak wavelength $\lambda p$, the In composition ratio x is lower than the In composition ratio of a well layer in which the lattice length is substantially equal to the lattice constant. In other words, the In composition ratio x for obtaining a desired peak wavelength $\lambda p$ is low. By the In composition ratio x being low, high crystallinity can be maintained.

In other words, in the case where the light emitting layer 30 is configured so as to obtain a peak wavelength substantially equal to a prescribed peak wavelength $\lambda p$, the well layer thickness t1 is smaller than the thickness of a well layer in which the lattice length is substantially equal to the lattice constant. When the well layer thickness t1 is reduced to increase the effect of confining carriers to enhance the light emission efficiency, the decrease in the peak wavelength $\lambda p$ due to the reduction in the well layer thickness t1 is compensated by the increase in the peak wavelength $\lambda p$ due to the tensile strain. Thereby, desired characteristics are obtained without compensating the decrease in the peak wavelength $\lambda p$ due to the reduction in the well layer thickness t1 with an increase in the In composition ratio x.

Thus, in the embodiment, the effect of confining carriers is increased by reducing the well layer thickness t1. Consequently, the region where the distribution of electrons and the distribution of holes overlap (overlap integral) is increased. Thereby, a high light emission efficiency can be obtained.

When the first semiconductor layer 10 and the second semiconductor layer 20 have a tensile stress and the tensile stress is excessively large, a crack may occur, for example. Hence, it is generally considered that these semiconductor layers are preferably made to have no tension. When a nitride semiconductor layer is formed on a silicon substrate, a tensile stress is likely to occur in the nitride semiconductor layer and a crack is likely to occur, for example. Thus, there are many reports on means for reducing the tensile stress, for example applying a compressive stress. That is, in general, the idea of applying no tensile stress or reducing the tensile stress is adopted.

In contrast, in the embodiment, a moderate tensile strain is given to the semiconductor layer. The tensile strain is positively utilized. That is, by providing the first semiconductor layer 10 with a tensile strain, the compressive stress (compressive strain) generated in the well layer 32 due to the lattice constant between the first semiconductor layer 10 and the well layer 32 is reduced. Thus, by controlling the band gap energy of the well layer 32, for example by reducing the thickness of the well layer 32 for obtaining a peak wavelength λp of the objective, the light emission efficiency is improved. The In composition ratio x for obtaining a peak wavelength λp of the objective is reduced to enhance crystallinity, and the light emission efficiency is improved, for example.

Examples of the strain of the first semiconductor layer 10 and the second semiconductor layer 20 will now be described.

Figure 8:
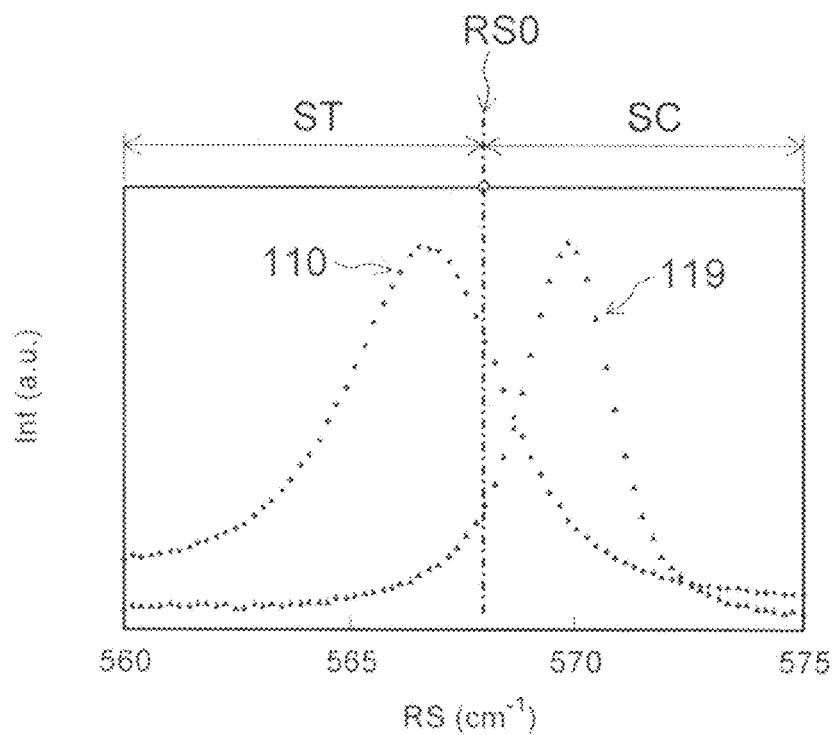
FIG. 8 is a graph illustrating characteristics of semiconductor light emitting elements.

FIG. 8 is a graph illustrating characteristics of semiconductor light emitting elements.

FIG. 8 illustrates Raman spectra of the GaN crystal used for the first semiconductor layer 10 and the second semiconductor layer 20. In this example, characteristics when the GaN crystal has a tensile strain (for example, the semiconductor light emitting element 110) and characteristics when the GaN crystal has a compressive strain (for example, the semiconductor light emitting element 119) are illustrated. The horizontal axis of FIG. 8 is the wave number RS (cm$^{-1}$). The vertical axis is the intensity Int (an arbitrary unit).

As shown in FIG. 8, the wave number RS0 in a GaN crystal with no strain is approximately 568 cm$^{-1}$. In the conditions ST where the wave number RS of the peak of the Raman spectrum is smaller than that value, the GaN crystal has a tensile strain. In the conditions SC where the wave number RS of the peak of the Raman spectrum is larger than that value, the GaN crystal has a compressive strain.

As illustrated in FIG. 8, in the semiconductor light emitting element 110, the wave number RS of the peak of the Raman spectrum is approximately 566 cm$^{-1}$. On the other hand, in the semiconductor light emitting element 119, the wave number RS of the peak of the Raman spectrum is approximately 570 cm$^{-1}$. This shows that, in the semiconductor light emitting element 110, the GaN crystal has a tensile strain; and in the semiconductor light emitting element 119, the GaN layer has a compressive strain.

Thus, the strain that the crystal layer has can be assessed from the shift of the Rama spectrum.

When the lattice constant of the crystal layer (the lattice spacing when there is no strain) is denoted by S0 and the actual lattice length of the crystal layer (the lattice spacing) is denoted by S1, the strain SS is expressed by Formula 3.

$$SS=(S1-S0)/S0 \times 100\% \quad (3)$$

When the strain SS is plus, the crystal layer has a tensile stress. When the strain SS is minus, the crystal layer has a compressive stress.

Such a strain SS can be calculated from the Raman spectrum as mentioned above. The wave number of the crystal layer when there is no strain is denoted by RS0, and the wave number of the crystal layer when it has a strain is denoted by RS1. At this time, the strain SS1 can be found practically by Formula 4.

$$SS1=(RS1-RS0)/1200 \quad (4)$$

That is, the strain SS1 calculated from the Raman spectrum can be used practically as the strain SS of the crystal layer.

In the example shown in FIG. 8, it is found that in the semiconductor light emitting element 110, the first semiconductor layer 10 has a tensile strain (SS1) of 0.1%. On the other hand, it is found that in the semiconductor light emitting element 119, the first semiconductor layer 10 has a compressive strain (SS1) of 0.15%.

In the embodiment, the tensile strain that the first semiconductor layer 10 has is preferably not less than 0.02% and not more than 0.25%. If the tensile strain is smaller than 0.02%, the effect of improving the light emission efficiency is reduced. If the tensile strain is larger than 0.25%, a crack or the like is likely to occur, for example. In the embodiment, the tensile strain is more preferably 0.03% or more. Thereby, the effect of improving the light emission efficiency is further increased. In the embodiment, the tensile strain is still more preferably 0.05% or more. Thereby, the effect of improving the light emission efficiency is still further increased. On the other hand, the tensile strain is more preferably 0.2% or less. Thereby, the occurrence of a crack can be more suppressed.

Formula 2 above is effective when the magnitude of the tensile strain that the first semiconductor layer 10 and the second semiconductor layer 20 have is not less than 0.02% and not more than 0.25%.

In the embodiment, it is approximated that the relationship between the In composition ratio x and the peak wavelength λp is invariant when the tensile strain is not less than 0.02% and not more than 0.25%.

In an example according to the embodiment, when the tensile strain is not less than 0.02% and not more than 0.25% and the peak wavelength λp is not less than 410 nm and not more than 470 nm, the well layer thickness t1 is not less than 2.0 nm and not more than 4.5 nm, and at this time the In composition ratio x is not less than 0.1 and not more than 0.22, for example.

In another example according to the embodiment, when the tensile strain is not less than 0.03% and not more than 0.25% and the peak wavelength λp is not less than 430 nm and not more than 450 nm, the well layer thickness t1 is not less than 2.0 nm and not more than 3.5 nm, and at this time the In composition ratio x is not less than 0.1 and not more than 0.18, for example.

In yet another example according to the embodiment, when the tensile strain is not less than 0.05% and not more than 0.2% and the peak wavelength λp is not less than 430 nm and not more than 450 nm, the well layer thickness t1 is not less than 2.0 nm and not more than 3.5 nm, and at this time the In composition ratio x is not less than 0.11 and not more than 0.18, for example.

The semiconductor layer (the stacked body of the first semiconductor layer 10, the light emitting layer 30, and the second semiconductor layer 20) in the semiconductor light emitting element 110 according to the embodiment may be formed on a silicon crystal (a silicon substrate) with a surface of the (111) plane, for example. In this case, the crystal of the semiconductor layer is oriented substantially in the c-axis direction. The angle between the c-axis direction of the first semiconductor layer 10 and the stacking direction (the Z-axis direction) is 5 degrees or less, for example. The angle between the c-axis direction and the X-Y plane (also the interface between the first semiconductor layer 10 and the light emitting layer 30 is possible) is not less than 85 degrees and not more than 95 degrees, for example.

The equivalent lattice length of a silicon crystal with a surface of the (111) plane is larger than the lattice constant in the a-axis direction of a gallium nitride crystal. The thermal expansion coefficient of a silicon crystal is smaller than the thermal expansion coefficient of a gallium nitride crystal. Therefore, when gallium nitride is formed by crystal growth on a silicon crystal with a surface of the (111) plane and then the temperature is lowered to room temperature, the gallium nitride crystal is likely to receive an in-plane tensile stress. Thus, as a method for providing the first semiconductor layer 10 and the second semiconductor layer 20 with a tensile strain, there is a method in which these semiconductor layers are formed on a silicon crystal with a surface of the (111) plane. That is, a silicon crystal substrate with a surface of the (111) plane can be used as the growth substrate 50.

In the semiconductor light emitting element 110 illustrated in FIG. 2, semiconductor layers are formed by crystal growth on the growth substrate 50, then the growth substrate 50 is peeled off, and the semiconductor layers are joined to the support substrate 40. Thus, even after the growth substrate is peeled off, the tensile strain generated in the semiconductor layers still remains. The remaining tensile strain can be estimated by the Raman spectrum of the semiconductor layers, for example.

A method for calculating the thickness of the well layer 32 and the In composition ratio x in the well layer 32 will now be described. In the following, the case where the light emitting layer 30 has an MQW structure, which is a complicated structure, is described. In the following, the case where a GaN crystal layer and the light emitting layer 30 are formed by crystal growth on a silicon crystal substrate with a surface of the (111) plane is described as an example.

Figure 9:
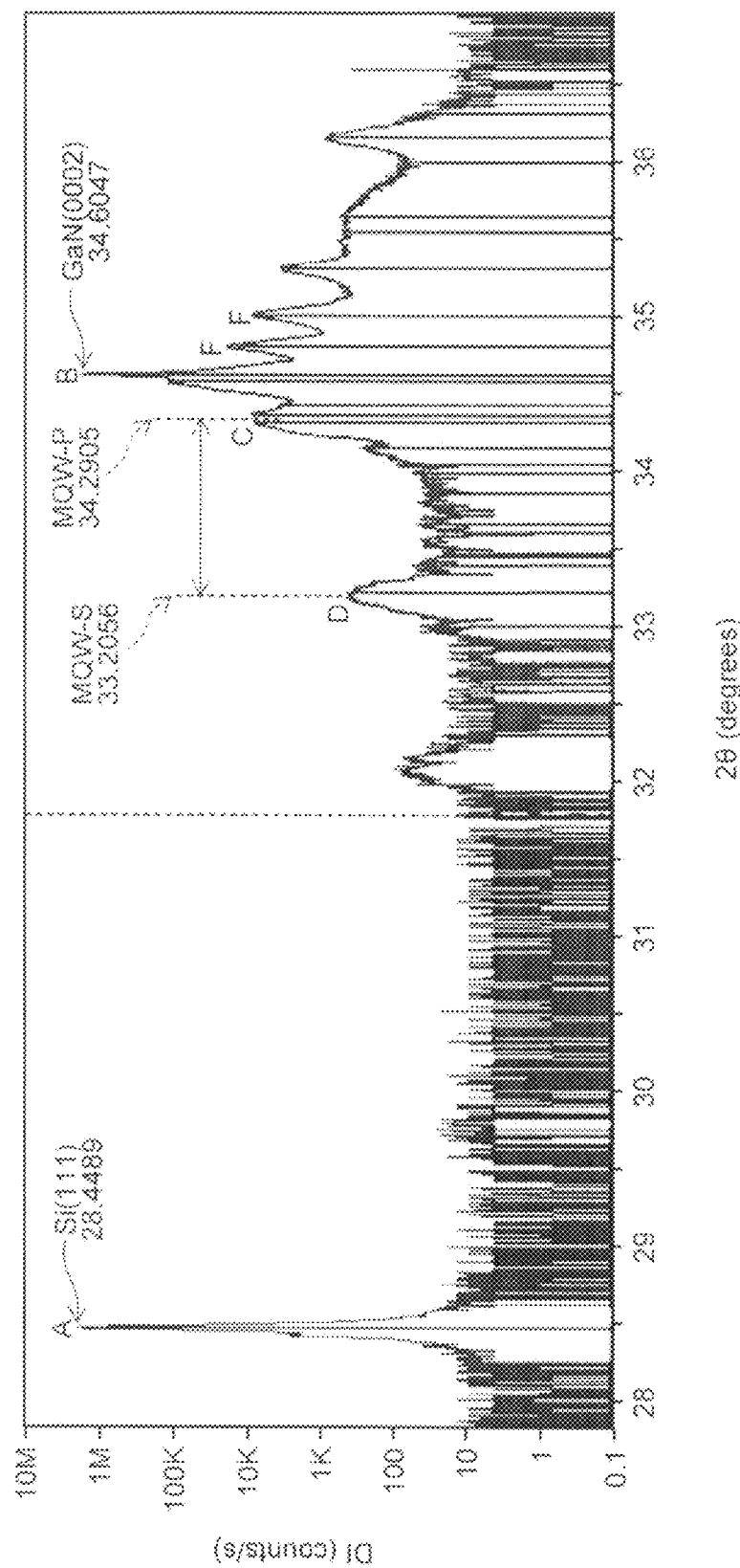
FIG. 9 is a diagram illustrating the result of X-ray diffraction (XRD) of the semiconductor light emitting element.

FIG. 9 is a diagram illustrating the result of X-ray diffraction (XRD) of the semiconductor light emitting element.

The horizontal axis of FIG. 9 is the angle 2θ (degrees), and the vertical axis represents the intensity DI (counts/second). The X-ray used for the XRD is a CuKα line. The wavelength of the X-ray used for the XRD is 0.1541838 nm.

First, using XRD, the strain (stress) in the GaN crystal layer (the first semiconductor layer 10 or the like), the average In composition ratio in the light emitting layer 30, and the period in the light emitting layer 30 (the total thickness of the well layer thickness t1 and the barrier layer t2) are found.

That is, first, the peak from the Si crystal is identified from the result of the XRD of FIG. 9. In FIG. 9, the peak indicated by A is diffraction from the Si crystal. It is assumed that there is no strain in the Si substrate crystal at this time. Subsequently, the peak from the GaN crystal layer is identified, and the strain of the GaN crystal layer is calculated from the angle 2θ of the diffraction peak. In FIG. 9, the peak indicated by B corresponds to diffraction from the GaN crystal layer. Taking the diffraction peak from the Si crystal as a reference, the lattice length in the c-axis direction of the GaN layer of this sample is found to be approximately 0.1% shorter than the lattice length in the c-axis direction of a GaN crystal with no strain. That is, in this sample, it is found that the lattice length in the a-axis direction of the GaN crystal layer is longer than the value of no strain (the lattice constant in the a-axis direction), and that the GaN crystal layer has a tensile strain in the a-axis direction. The direction of the tensile strain (tensile stress) and the compressive strain (compressive stress) has been defined by the expansion and contraction from the lattice constant of the lattice length in the a-axis direction. Next, the peak MQW-P of the light emitting layer 30 is identified, and the average In composition ratio in the light emitting layer 30 of InGaN/GaN is calculated. At this time, the light emitting layer 30 is assumed to be a single layer having the average In composition ratio. In this measurement result, the diffraction peak corresponding to the light emitting layer 30 is indicated by C. The lattice length in the c-axis direction is found from this peak, and the In composition ratio of the light emitting layer 30 (the average In composition ratio in the light emitting layer 30) is estimated. In this case, the average In composition ratio is 0.0522.

Further, the spacing of MQW-S is found from a satellite peak (indicated by D in FIG. 9) that appears accompanyingly around the peak from the light emitting layer 30, and the period of the interior of the light emitting layer 30 is estimated. Herein, a combination of the well layer 32 and the barrier layer 34 is taken as one pair, and the thickness of the one pair (period) is calculated to be 8.12 nm.

On the other hand, the thickness of the well layer 32 is obtained from the observation result of a transmission electron microscope (TEM).

Figure 10:
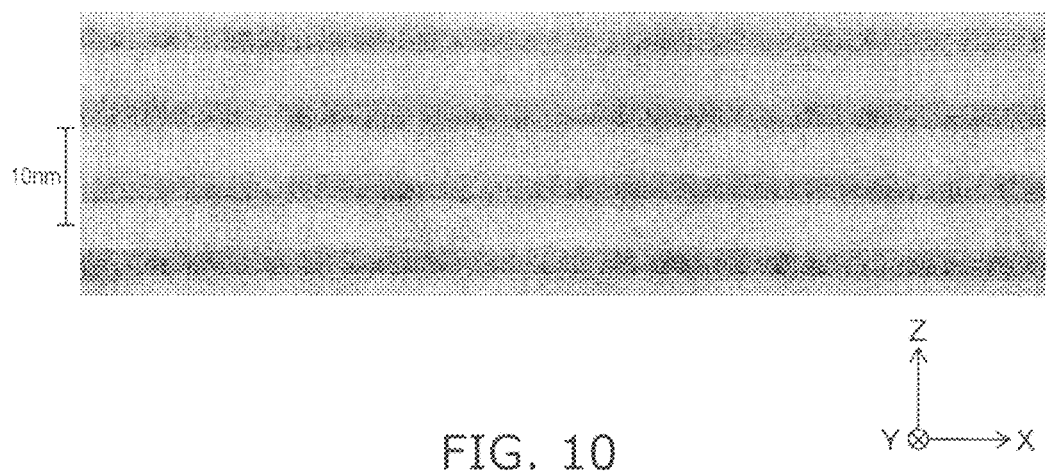
FIG. 10 is a photograph illustrating an observed image of a transmission electron microscope of the semiconductor light emitting element.

FIG. 10 is a photograph illustrating an observed image of a transmission electron microscope of the semiconductor light emitting element.

From the observed image of the TEM shown in FIG. 10, the thickness of one well layer 32 (the well layer thickness t1) in this sample is found to be 2.7 nm. The thickness of the barrier layer 34 (the barrier layer thickness t2) is found to be 5.4 nm. These values substantially agree with the thickness of the one pair found from the XRD mentioned above (8.12 nm). From the well layer thickness t1, the barrier layer thickness t2, and the average In composition ratio, the In composition ratio x of the well layer 32 is found to be 0.155.

Thus, in the light emitting layer 30 having an MQW structure, the thickness of one well layer 32 (the well layer thickness t1) and the In composition ratio x can be found. On the other hand, the semiconductor light emitting element is operated, and an emission spectrum is used to find the peak wavelength λp.

Figure 11:
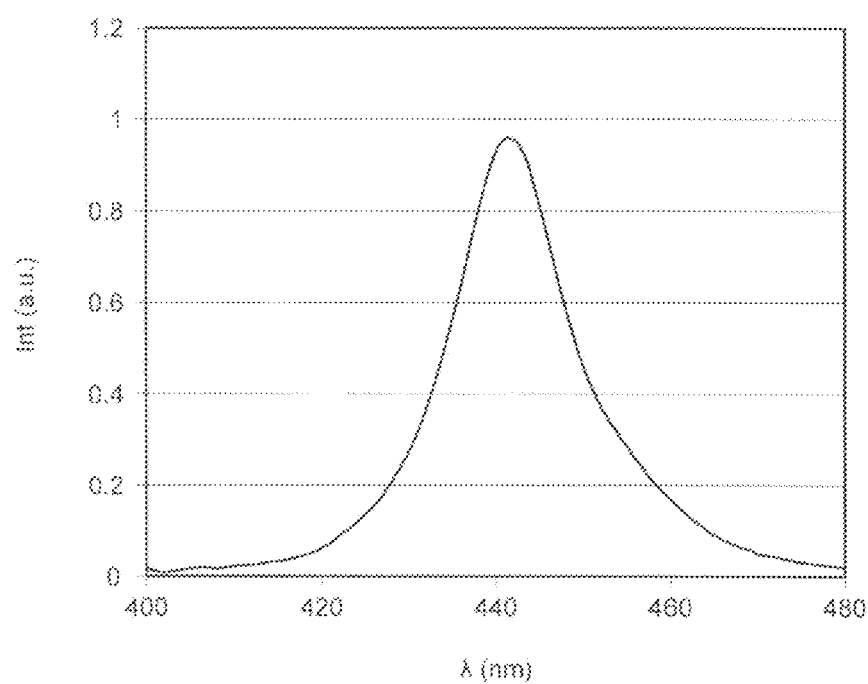
FIG. 11 is a diagram illustrating an emission spectrum of the semiconductor light emitting element.

FIG. 11 is a diagram illustrating an emission spectrum of the semiconductor light emitting element.

FIG. 11 shows an emission spectrum of the sample of the XRD and the TEM observation mentioned above. The horizontal axis of FIG. 10 is the wavelength A (nm), and the vertical axis is the intensity Int (an arbitrary unit). As can be seen from FIG. 10, the peak wavelength λp of light emission is 441.6 nm. In this way, the well layer thickness t1, the In composition ratio x of the well layer 32, and the peak wavelength λp in the semiconductor light emitting element can be found. Examples of the measured values of the relationships between them are shown in FIG. 1.

There are many reports on the relationship between the In composition ratio x and the band gap energy in InGaN crystals. It is possible to some extent to discuss the peak wavelength in the semiconductor light emitting element using an InGaN crystal for the active layer on the basis of those reports. However, in the case where InGaN is used as the well layer in the semiconductor light emitting element, the thin film InGaN crystal layer sandwiched by a GaN crystal with a smaller lattice constant receives a stress, whereas there are few findings on the stress dependence of the band gap. Hence, it is not easy to correctly estimate the relationship between the In composition ratio and the band gap in the well layer containing InGaN.

Furthermore, the stress in the GaN crystal layer varies between when a GaN crystal layer of an underlayer is grown on a sapphire substrate and when it is grown on a Si substrate. Therefore, the stress applied to the well layer containing InGaN is more complicated. In addition, there are influences of the quantum level formed in accordance with the width of the well layer etc. Therefore, it is actually difficult to correctly calculate the peak wavelength from design values of the semiconductor light emitting element including an InGaN-based well layer. Thus, it is effective to set the conditions of the GaN crystal layer of an underlayer, the In composition ratio of the well layer, the width of the well layer, etc., and then accumulate data regarding the band gap and the peak wavelength using experiential findings.

The inventors of this application has fabricated various semiconductor light emitting elements under conditions where the internal stress of the GaN layer of an underlayer is different, and has actually measured the relationship between the In composition ratio of the well layer and the peak wavelength of the semiconductor light emitting element. Then, data were accumulated regarding how the relationship changes with the thickness of the well layer. That is, the growth parameter of an MOCVD apparatus for forming GaN/InGaN-based semiconductor light emitting elements was changed, and various semiconductor light emitting elements were fabricated. Then, the MQW structures in the semiconductor light emitting elements were analyzed, and the relationships between the thickness of the well layer (the well layer thickness t1), the In composition ratio x of the well layer, and the peak wavelength $\lambda p$ were investigated. Thus, the configuration according to the embodiment has been found.

Next, an example of the influence that the density of dislocations produced in the semiconductor crystal layer has on the characteristics of the semiconductor light emitting element is described.

Figure 12:
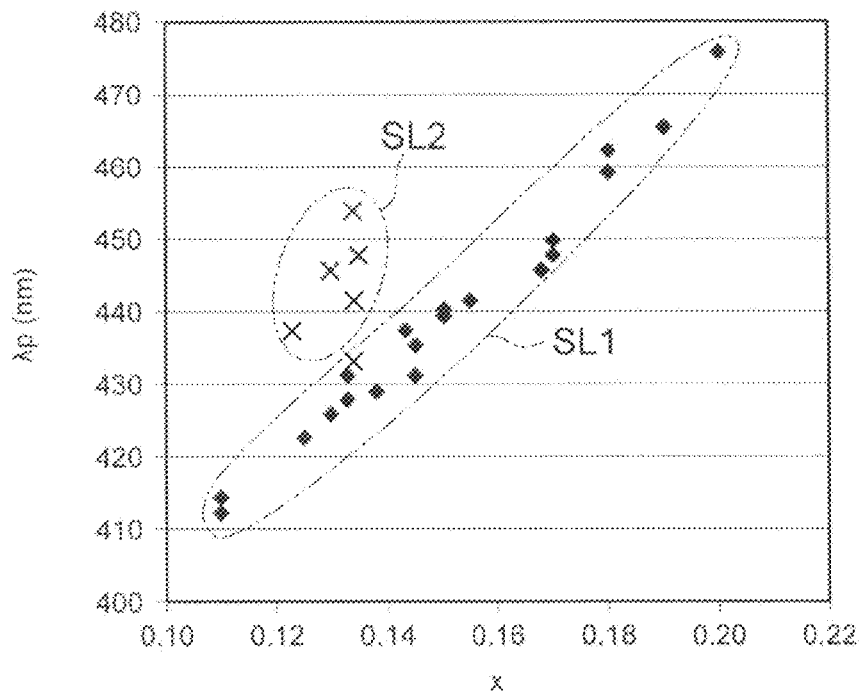
FIG. 12 is a graph illustrating characteristics of the semiconductor light emitting element.

FIG. 12 is a graph illustrating characteristics of the semiconductor light emitting element.

The horizontal axis of FIG. 12 is the In composition ratio x of the well layer 32, and the vertical axis is the peak wavelength $\lambda p$ (nm).

FIG. 12 shows characteristics when the dislocation density in the semiconductor crystal layer is $1.5 \times 10^9$ cm$^{-2}$ or less (SL1) and characteristics when the dislocation density in the semiconductor crystal layer is higher than $1.5 \times 10^9$ cm$^{-2}$ (SL2). Herein, the well layer thickness t1 is 3.0 nm.

As can be seen from FIG. 12, the peak wavelength $\lambda p$ is longer when the dislocation density in the semiconductor crystal layer is higher than $1.5 \times 10^9$ cm$^{-2}$ (characteristics SL2) than when the dislocation density is $1.5 \times 10^9$ cm$^{-2}$ or less (characteristics SL1).

This is presumed to be because, although at this time the tensile strain that the first semiconductor layer 10 has is invariant (approximately 0.1%), the compressive stress in the well layer 32 containing InGaN of the light emitting layer 20 is relaxed by dislocations, and the bang gap energy Eg is narrowed. If a dislocation (or a defect) has occurred in the InGaN layer, the dislocation (or defect) forms a non-light emission recoupling center. Consequently, the light emission efficiency of the semiconductor light emitting element becomes very low.

That is, when the dislocation density is $1.5 \times 10^9$ cm$^{-2}$ or more, the In composition for obtaining the same wavelength is low, but the light emission efficiency is very low. Hence, in the embodiment, the dislocation density in the semiconductor layer is preferably $1.5 \times 10^9$ cm$^{-2}$ or less.

During the growth of the GaN layer, island-like (three-dimensional) growth and lateral (two-dimensional) growth may be performed repeatedly. Thereby, a GaN crystal layer with a low dislocation density can be easily formed on a Si substrate, for example. The island-like growth of the GaN layer and the lateral growth of the GaN layer can be controlled by at least one of the temperature in the growth and the V/III ratio. For example, when the V/III ratio is low, island-like growth is likely to occur. When the V/III ratio is high, lateral growth is likely to occur. The V/III ratio is the flow rate ratio between the group III material such as trimethylgallium and the group V material such as ammonia, for example.

A stress control layer of AlGaN or the like may be interposed to make it easier for the GaN layer grown thereon to make island-like growth. Furthermore, $\delta$-doping of Si atoms may be performed to make it easier for the GaN layer grown thereon to make island-like growth. In the $\delta$-doping, the supply of TMG is stopped to stop the growth of the GaN layer, and ammonia gas and silane gas are supplied to supply Si atoms, for example.

When the density of islands of island-like growth is high, the effect of dislocation density reduction by means of the combination with the lateral direction characteristics is high. When the height of the island is low, the effect of dislocation density reduction by means of the combination with the lateral direction characteristics is high.

In the embodiment, the light emitting layer 30 preferably has an MQW structure. The number of pairs of the well layer 32 and the barrier layer 34 in the MQW structure is preferably 4 or more. The number of pairs is more preferably 8 or more. In the embodiment, the flexibility of the thickness of the barrier layer 34 (the barrier layer thickness t2) is relatively high. When the thickness of the barrier layer 34 is small, the operating voltage of the semiconductor light emitting element can be reduced, for example. The thickness of the barrier layer 34 is preferably 5.0 nm or less.

In the embodiment, the method for providing the semiconductor layer with a tensile strain is arbitrary. For example, a tensile strain can be generated by using a silicon substrate as the growth substrate 50 in growing the semiconductor layer (nitride semiconductor). At this time, the growth conditions for the semiconductor layer are set to conditions by which a tensile strain is generated. On the other hand, when a sapphire substrate is used as the growth substrate, in general a compressive strain is formed in the semiconductor layer, for example.

Other than this, a tensile strain may be generated in the semiconductor layer by the support substrate 40, for example. The thermal expansion coefficient of the support substrate 40 is set larger than the thermal expansion coefficient of the semiconductor layer, for example. Then, an appropriate heat treatment may be performed to generate a tensile strain in the semiconductor layer. The strain generated in the semiconductor layer may be adjusted by a strain adjustment layer.

Figure 13:
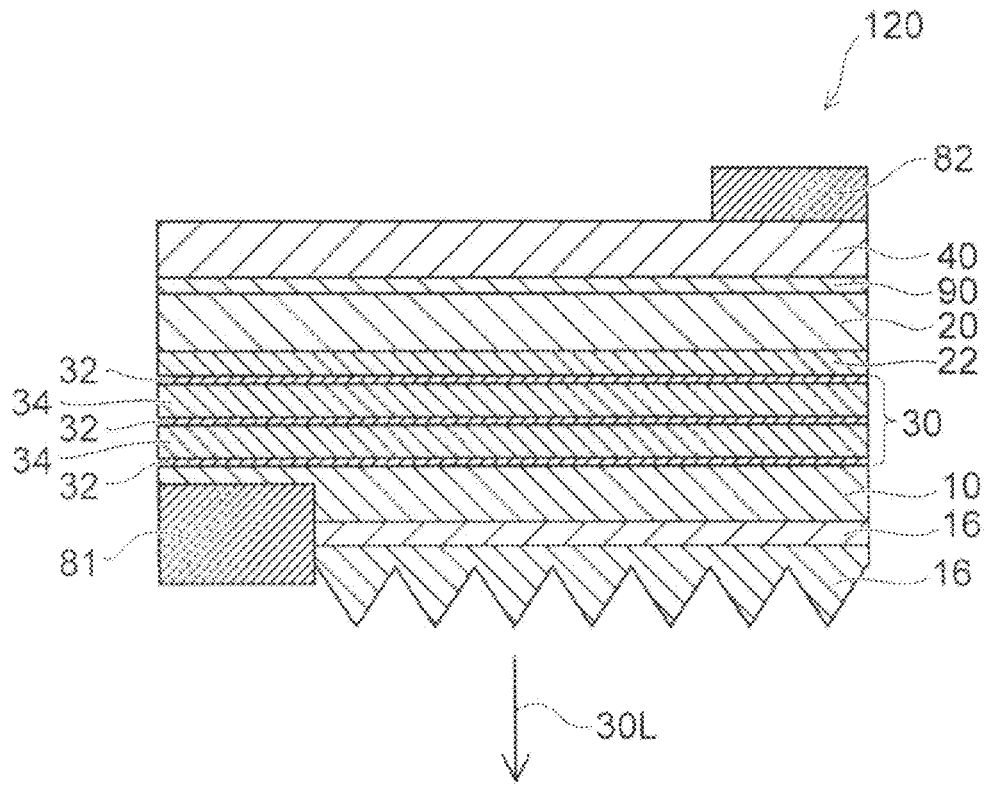
FIG. 13 is a schematic cross-sectional view illustrating another semiconductor light emitting element according to the embodiment.

FIG. 13 is a schematic cross-sectional view illustrating another semiconductor light emitting element according to the embodiment.

A semiconductor light emitting element 120 shown in FIG. 13 includes a GaN layer 15 (not shown), a first strain adjustment layer 16, and a second strain adjustment layer 22. Otherwise, the configuration is similar to the semiconductor light emitting element 110, and a description is omitted.

The first semiconductor layer 10 is disposed between the GaN layer 15 and the light emitting layer 30. The first strain adjustment layer 16 is disposed between the GaN layer 15 and the first semiconductor layer 10. On the other hand, the second strain adjustment layer 22 is disposed between the second semiconductor layer 20 and the light emitting layer 30.

The lattice constant of the first strain adjustment layer 16 is smaller than the lattice constant of the first semiconductor layer 10. The first strain adjustment layer 16 includes an AlN layer, for example. The first strain adjustment layer 16 may include an AlGaN layer. By the first strain adjustment layer 16, the magnitude of the tensile strain generated in the first semiconductor layer 10 can be adjusted.

The lattice constant of the second strain adjustment layer 22 is smaller than the lattice constant of the first semiconductor layer 10. The second strain adjustment layer 22 includes an AlN layer, for example. The second strain adjustment layer 22 may include an AlGaN layer. The second strain adjustment layer 22 adjusts the tensile strain generated in the first semiconductor layer 10 and the second semiconductor layer 20, for example.

Figure 14:
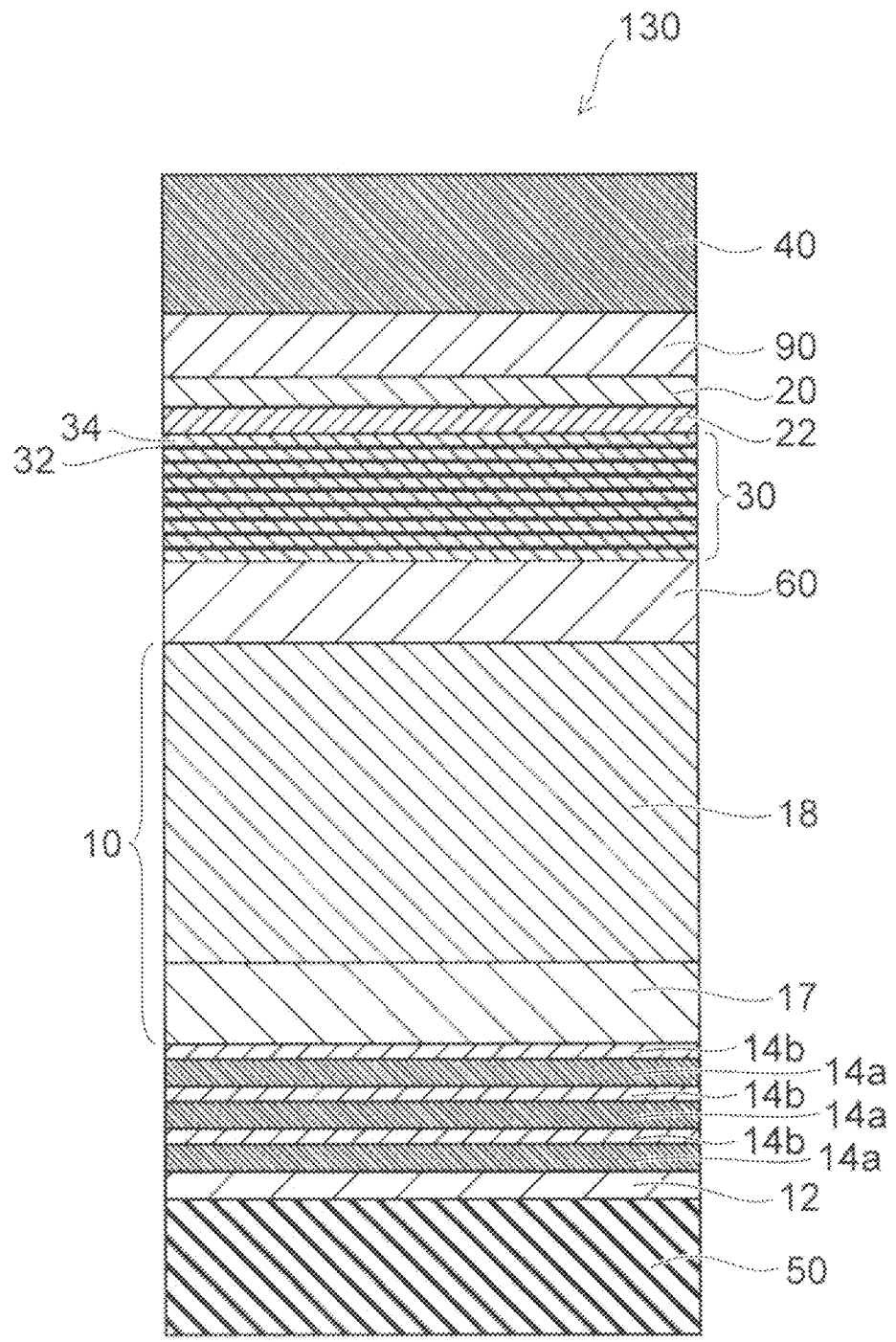
FIG. 14 is a schematic cross-sectional view illustrating another semiconductor light emitting element according to the embodiment.

FIG. 14 is a schematic cross-sectional view illustrating another semiconductor light emitting element according to the embodiment.

As shown in FIG. 14, in a semiconductor light emitting element 130 according to the embodiment, a buffer layer 12 including an AlN layer and an AlGaN layer is disposed on the growth substrate 50. A plurality of i-GaN layers 14a and a plurality of AlN layers 14b are alternately provided on the buffer layer 12. The thickness of the i-GaN layer 14 is 300 nm, for example. The thickness of the AlN layer 14b is 15 nm, for example. The first semiconductor layer 10 is provided on these layers. The first semiconductor layer 10 includes an n-type GaN layer 18 with a thickness of 2 μm and an i-GaN layer 17 with a thickness of 1 μm.

An SLS (super lattice structure) layer 60 is provided on the first semiconductor layer 10. In the SLS layer 60, a plurality of GaN layers and a plurality of InGaN layers are alternately arranged. The thickness of the GaN layer is 3 nm, for example. The In composition ratio in the InGaN layer is 0.07. The thickness of the InGaN layer is 1 nm, for example. The GaN layer and the InGaN layer are taken as one pair, and the number of pairs is 30.

The light emitting layer 30 is provided on the SLS layer 60. The light emitting layer 30 has an MQW structure. In this example, a combination of the barrier layer 34 and the well layer 32 is taken as one pair, and the number of pairs is 8, for example. GaN is used for the barrier layer 34, for example. The thickness of the barrier layer 34 is 5 nm, for example. InGaN with an In composition ratio x of 0.15 is used for the well layer 32, for example. The thickness of the well layer 32 is 3 nm, for example.

A p-type AlGaN layer with an Al composition ratio of 20% (the second strain adjustment layer 22) is disposed on the light emitting layer 30. A p-type GaN layer (the second semiconductor layer 20) is disposed on the p-type AlGaN layer (the second strain adjustment layer 22). The conductive layer 90 (for example, a reflection metal layer) is disposed on the p-type GaN layer (the second semiconductor layer 20). The support substrate 40 is provided on the reflection metal layer 90. As described above, the growth substrate 50 is peeled off to complete the element, for example.

A method for manufacturing a semiconductor light emitting element according to the embodiment will now be described. In the following, a method for manufacturing the semiconductor light emitting element 130 is described.

FIG. 15A to FIG. 15C, FIG. 16A to FIG. 16D, and FIG. 17A to FIG. 17F are schematic cross-sectional views in order of the steps, illustrating a method for manufacturing a semiconductor light emitting element according to the embodiment.

A silicon substrate with a surface of the (111) plane is prepared as the growth substrate 50, for example. The thickness of the growth substrate 50 is approximately 525 μm, for example. The thickness of the growth substrate 50 may be not less than 250 μm and not more than 1000 μm, for example.

Acid treatment washing is performed on the growth substrate 50 (a silicon substrate). For example, acid washing treatment for removing the contaminants on the substrate surface is performed, and then the growth substrate 50 is treated with a dilute hydrofluoric acid solution with a concentration of approximately 1% for approximately one minute. By the treatment, the silicon crystal surface of the growth substrate 50 becomes a hydrogen-terminated surface structure, and becomes a water-repellent surface. The hydrogen atoms covering the silicon crystal surface are eliminated at a temperature of approximately 700° C. Thereby, a clean silicon crystal surface can be obtained. As another method for obtaining a clean silicon crystal surface, there is a method in which a silicon crystal substrate with the surface covered with a thin natural oxide film is heat-treated at a high temperature of 1000° C. or more.

The growth substrate 50 with the surface hydrogen-terminated is introduced into a film formation apparatus (MOCVD apparatus) in which an organic metal and ammonia gas are used as the source material. Also an ECR plasma sputtering apparatus, an MBE apparatus, or the like may be used as the film formation apparatus.

By the MOCVD apparatus, an AlN layer with a thickness of 100 nm is formed at a film formation temperature of 1200° C. At this time, TMA (trimethylaluminum) and $NH_3$ (ammonia) are used as the source material. Then, the substrate temperature is set to 1100° C., and TMG (trimethylgallium) is added to form an AlGaN layer with an Al composition ratio of 25% and a thickness of 250 nm. The AlN layer and the AlGaN layer thus formed correspond to the buffer layer 12.

After that, TMG (trimethylgallium) and $NH_3$ (ammonia) are used as the source material to form the GaN layer 14a with a thickness of not less than 0.3 μm and not more than 1.0 μm. After that, the film formation temperature is lowered to 700° C. to grow the AlN layer 14b with a thickness of 15 nm. The AlN layer 14b functions as a stress adjustment layer in the time of growth, for example. The GaN layer 14a and the AlN layer 14b are alternately formed in plural.

Subsequently, the i-GaN layer 17 is formed, and the n-type GaN layer 18 is formed thereon. The thickness of the i-GaN layer 17 is not less than 1 μm and not more than 3 μm, for example. The thickness of the n-type GaN layer 18 is not less than 1 μm and not more than 5 μm. The impurity concentration in the n-type GaN layer 18 is $1 \times 10^{19}$ cm$^{-3}$, for example. The portion of the i-GaN layer 17 and the n-type GaN layer 18 corresponds to the first semiconductor layer 10.

The SLS layer 60 is formed on the first semiconductor layer 10. The light emitting layer 30 is formed on the SLS layer 60. An AlGaN layer with an Al composition ratio of 20% and a thickness of 150 nm is formed as the second strain adjustment layer 22 on the light emitting layer 30. The second semiconductor layer 20 is formed on the second strain adjustment layer 22. Doping of Mg may be performed on the second strain adjustment layer 22. The doping concentration of Mg is $1 \times 10^{19}$ cm$^{-3}$ or more, and is $1 \times 10^{20}$ cm$^{-3}$. In the case where a Mg doping layer is formed by the MOCVD method, the doping concentration changes due to the memory effect. Consequently, a uniform doping profile is not necessarily obtained. Therefore, the doping concentration of Mg may deviate from the range described above.

As the method for forming the semiconductor layer, also the molecular beam epitaxy (MBE) method, the hydride vapor phase epitaxy (HVPE) method, or the like may be used as well as the vapor deposition method (the MOCVD method).

Figure 15A:
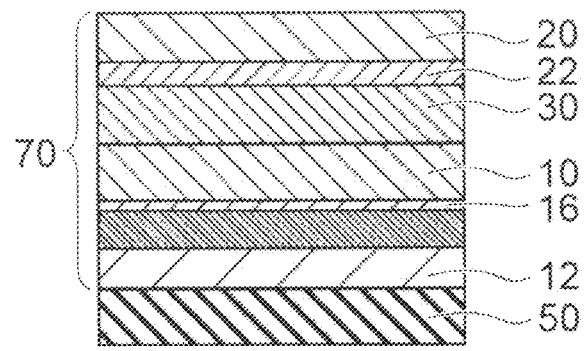
FIG. 15A to FIG. 15C are schematic cross-sectional views in order of the steps, illustrating a method for manufacturing a semiconductor light emitting element according to the embodiment.

FIG. 15A illustrates a thin film crystal layer 70 thus obtained. The thin film crystal layer 70 is formed by epitaxial growth.

Figure 15B:
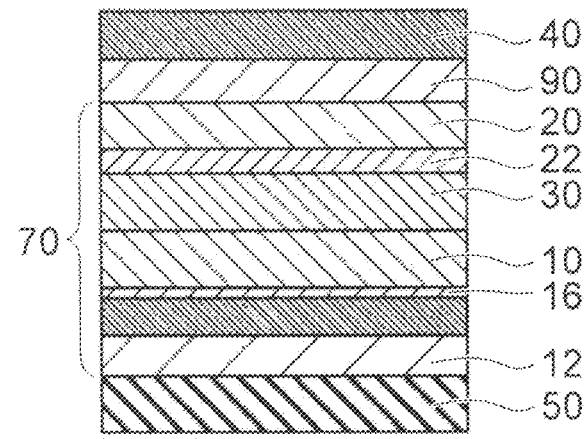

As shown in FIG. 15B, the conductive layer 90 is formed on the surface of the second semiconductor layer 20. The conductive layer 90 functions as a reflection film and contact layer. A silver nickel layer, which is a metal film containing Ag, is formed as the conductive layer 90, for example. After that, the support substrate 40 is bonded via an intermediate layer of a metal such as Ti, W, Pt, and Au (not shown) and a bonding metal (for example, gold tin alloy (not shown)). Copper or the like is used for the support substrate 40, which is electrically conductive. The thickness of the support substrate 40 is not less than 100 µm and not more than 200 µm, for example. At least part of the conductive layer 90 serves as a p-side electrode (the second electrode 82).

Figure 15C:
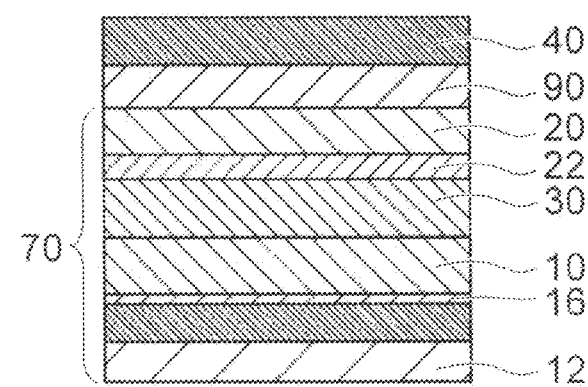

As shown in FIG. 15C, the growth substrate 50 is removed. That is, after the support substrate 40 is bonded to the second semiconductor layer 20 side, the growth substrate 50 is ground to be removed. At this time, after part of the growth substrate 50 is removed by grinding, the rest of the growth substrate 50 is removed by dry etching using $SF_6$ gas as the etchant, for example. Thereby, the AlN layer (the buffer layer 12) formed on the growth substrate 50 at the beginning is exposed, for example.

Here, the AlN layer has the property of increasing the level of resistance components. Hence, for the semiconductor light emitting element having the stacked structure described above in regard to FIG. 14, there is an example in which an AlN-based buffer layer (for example, the buffer layer 12 including an AlN layer) and an AlN-based stress-adjustment-in-growth layer are removed to expose the n-type GaN layer 18 and then an n-side electrode is provided. Specifically, the AlN-based buffer layer or the AlN layer has a high contact resistance from the viewpoint of electrode formation. In addition, the level of series resistance components is increased. Hence, in a common process, the AlN-based buffer layer and the AlN-based stress-adjustment-in-growth layer in the electrode formation portion are removed to expose the n-type GaN layer in the portion where the n-side electrode (the first electrode 81) will be formed.

On the other hand, in the following, an example is described including the case where the buffer layer 12 is removed and on the other hand the AlN-based stress-adjustment-in-growth layer is used as the first strain adjustment layer.

Figure 16A:
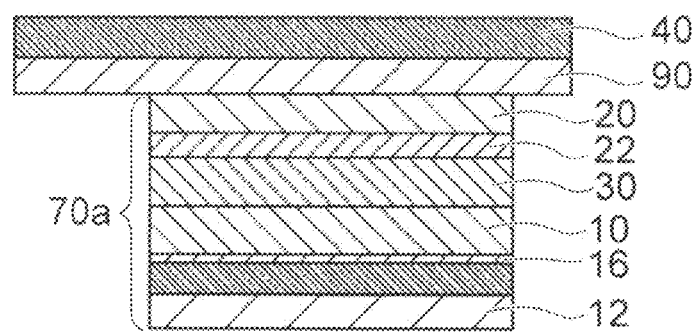
FIG. 16A to FIG. 16D are schematic cross-sectional views in order of the steps, illustrating a method for manufacturing a semiconductor light emitting element according to the embodiment.

As shown in FIG. 16A, the thin film crystal layer 70 is divided into nitride semiconductor crystal layer portions 70a by the size of the element. At this time, the substrate side below the p-type electrode (the second electrode 82) metal is kept in the not-divided state.

Figure 16B:
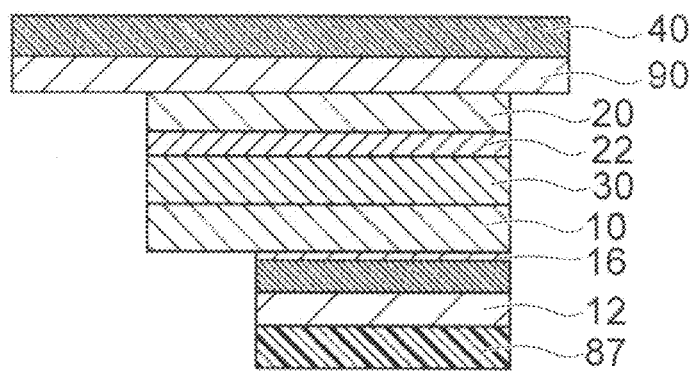

Subsequently, as shown in FIG. 16B, a portion other than the portion where the n-side electrode (the first electrode 81) will be formed is protected by a mask 87, and the buffer layer 12 to the stress-adjustment-in-growth layer are removed by etching to expose the first semiconductor layer 10 (n-type GaN).

Figure 16C:
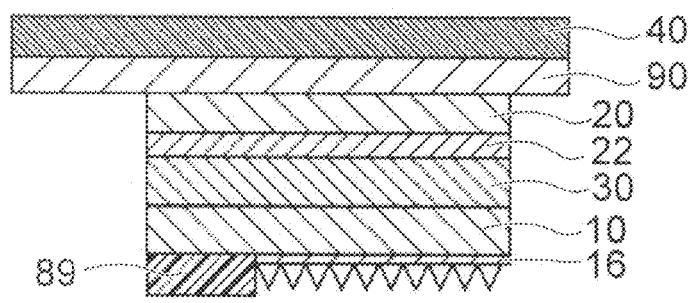
Figure 16D:
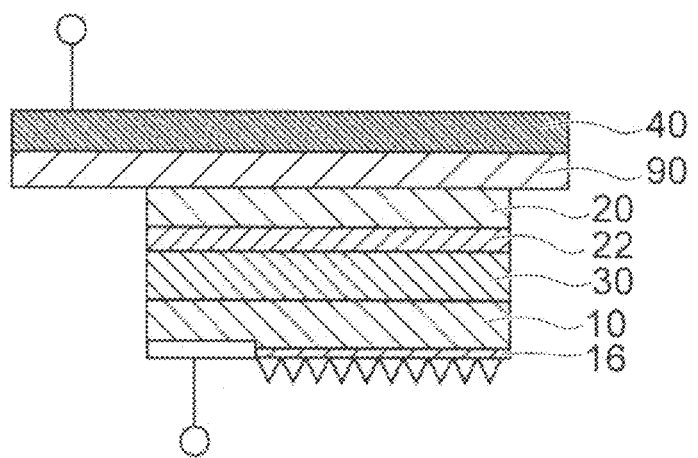

After that, as shown in FIG. 16C, only the portion where the n-side electrode (the first electrode 81) will be formed is protected by a mask 89, and roughening processing with a depth of approximately 500 nm is performed on the nitride semiconductor surface (the first semiconductor layer 10) side using a KOH solution. At this time, the AlN and the AlGaN layer (the buffer layer 12) exposed at the surface are removed by the etching. The AlN-based stress-adjustment-in-growth layer included in the thin film crystal layer 70 (the nitride semiconductor crystal layer portion 70a) is removed by the roughening processing of the nitride semiconductor surface. However, the AlN-based stress-adjustment-in-growth layer may not be removed but be left, and may be used as the first strain adjustment layer (see FIG. 16C). As shown in FIG. 16D, a p-type electrode and an n-type electrode are formed to complete the element.

In the fabrication method described above, a sequence is described in which the p-type electrode and the n-type electrode are formed from both sides of the nitride semiconductor crystal layer. However, it is also possible to form both electrodes (the p-type electrode and the n-type electrode) on the opposite side to the light extraction surface. A specific fabrication method will now be described.

The process in which the stacked structure of a nitride semiconductor thin film crystal having an LED structure is formed by epitaxial growth on the growth substrate 50 with a surface of the (111) plane is similar to the above and a description is omitted. After the epitaxial growth of the nitride semiconductor thin film crystal growth layer of an LED structure having a p-type GaN crystal layer on the surface is finished, first, a protection film 85 is formed on the entire surface of the p-type GaN layer. After that, a part is opened, and etching processing is performed. By the etching processing, the p-type layer, the second strain adjustment layer 22, and the light emitting layer 30 in the opening portion are etched to expose the n-GaN layer 10 (see FIG. 17A).

Figure 17A:
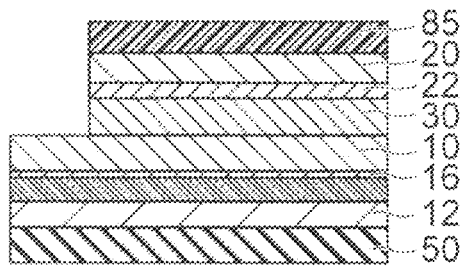
FIG. 17A to FIG. 17F are schematic cross-sectional views in order of the steps, illustrating a method for manufacturing a semiconductor light emitting element according to the embodiment.
Figure 17D:
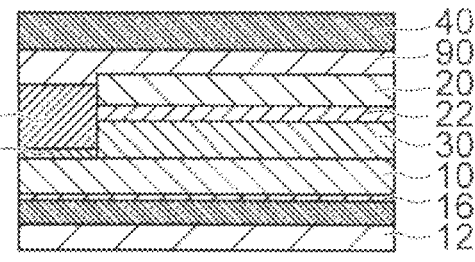
Figure 17B:
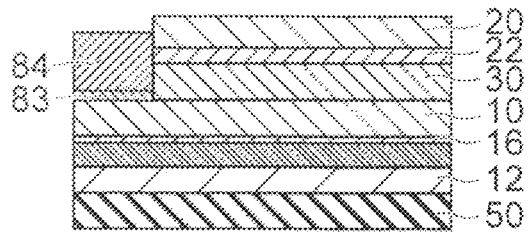
Figure 17E:
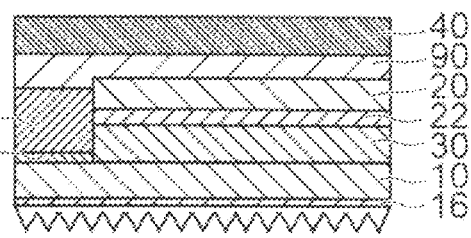
Figure 17C:
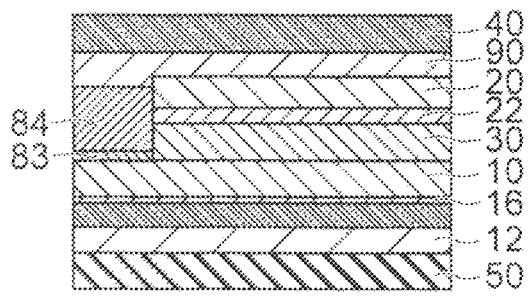
Figure 17F:
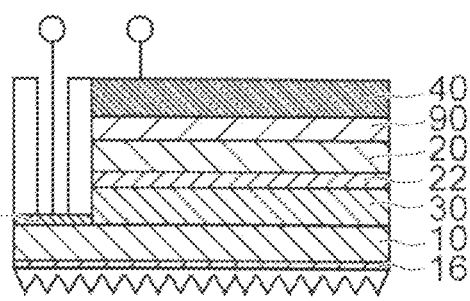

After that, as shown in FIG. 17B, an ohmic contact 83 is formed on the exposed portion of the n-GaN layer. The ohmic contact 83 contains at least one of the Ti, Al, Ni, and Au, for example.

After that, the protection film 85 covering the p-type GaN layer is removed, and a protection film 84 is formed in the n electrode formation portion. Then, the reflection metal layer 90 is stacked on the surface of the p-type GaN layer. Silver or an alloy containing silver as a main component is used for the reflection metal layer 90, for example. An intermediate layer (not shown) and a bonding metal layer are stacked on the reflection metal layer 90, for example. At least one metal of Ti, W, Au, Pt, and Al is used for the intermediate layer. Gold tin alloy is used for the bonding metal layer, for example. After that, the support substrate 40 is attached (see FIG. 17C). A metal such as copper is used for the support substrate 40, for example. The thickness of the support substrate 40 is preferably approximately 100 to 200 µm.

As shown in FIG. 17D, after the support substrate 40 is attached, the Si substrate 50 used for the epitaxial growth is peeled off to expose the AlN buffer layer 12. After the AlN buffer layer is exposed, roughening processing is performed on the exposed surface. At this time, the AlN buffer layer is removed. Then, the AlN-based stress-adjustment-in-growth layer is removed. Alternatively, the AlN-based stress-adjustment-in-growth layer is not removed but used as the first strain adjustment layer 16 (see FIG. 17E). In such an element fabrication process, there is no n-side electrode on the light extraction surface. Therefore, roughening processing can be performed on the entire surface.

After the roughening processing is finished, the n electrode portion of the support substrate 40 of copper is opened. Subsequently, the n extension electrode is exposed while being insulated from the support substrate 40, and an interconnection of the n electrode is connected. The substrate 40 can be utilized as the p-side electrode (see FIG. 17F).

Here, as described above, in the case where the n electrode is formed from the n-GaN layer side, the support substrate 40 of copper is attached onto the flat p-GaN layer immediately after the thin film crystal growth of an LED structure is finished. In contrast, in the process in which the n electrode is formed from the p-GaN layer side, the support substrate 40 of copper is attached onto the p-type GaN layer in which the n electrode portion has been formed beforehand. That is, it is necessary to attach the support substrate 40 of copper onto a surface with a portion having the unevenness of processing (not flat). At the time of attachment, the unevenness of the bonding surface is made to be followed by interposing the bonding metal layer. However, degradation in bonding conditions accompanying the occurrence of voids or the like may occur as compared to attachment to a flat surface. To address this problem, a method in which the support substrate 40 of copper is formed by a plating process is an effective means, rather than attaching the support substrate 40 of copper as a plate-like substrate as described above.

Specifically, processing for preparing the formation of the n electrode and the p electrode is performed on a substrate in which a nitride semiconductor crystal layer of an LED structure is formed by epitaxial growth on the growth substrate 50. After that, the reflection metal layer 90 and an intermediate layer are stacked by a vapor deposition layer or by the sputtering method or the like. Silver or a metal containing silver as a main component is used for the reflection metal layer 90. A metal such as Ti, W, and Pt is used for the intermediate layer, for example. Subsequently, a seed layer containing at least one of Ti and Cu is stacked, and the plating method is used to form a copper layer with a thickness of approximately 100 μm. In the case where the support substrate 40 of copper is formed by the plating method, a structure with high adhesion to the unevenness of the electrode formation portion can be fabricated.

The material of the conductive support substrate 40 may be gold (thermal conductivity: 295 $Wm^{-1}K^{-1}$ to 320 $Wm^{-1}K^{-1}$, thermal expansion coefficient: $14.2 \times 10^{-6}$ $K^{-1}$), silver (thermal conductivity: 418 $Wm^{-1}K^{-1}$, thermal expansion coefficient: $18.9 \times 10^{-6}$ $K^{-1}$), and the like, as well as copper (thermal conductivity: 370 $Wm^{-1}K^{-1}$ to 380 $Wm^{-1}K^{-1}$, thermal expansion coefficient: $16.6 \times 10^{-6}$ $K^{-1}$). The material of the conductive support substrate 40 may be also aluminum (thermal conductivity: 200 $Wm^{-1}K^{-1}$ to 230 $Wm^{-1}K^{-1}$, thermal expansion coefficient: $23.1 \times 10^{-6}$ $K^{-1}$). In addition, the material of the conductive support substrate 40 may be an alloy of the metals mentioned above, an alloy using the metals mentioned above as the matrix, or the like. The conductive support substrate 40 may have a stacked film structure in which a layer of the metals mentioned above, including alloys, is used as a main layer and another material is combined. That is, the support substrate 40 of the embodiment contains a metal selected from the group consisting of gold (Au), silver (Ag), copper (Cu), and aluminum (Al) or an alloy containing two or more selected from the group.

The embodiment provides a semiconductor light emitting element with a high light emission efficiency.

In the specification, "nitride semiconductor" includes all semiconductors expressed by the chemical formula of $B_xIn_yAl_zGa_{1-x-y-z}N$ ($0 \leq x \leq 1$, $0 \leq y \leq 1$, $0 \leq z \leq 1$, $x+y+z$ 1) in which the composition ratios x, y, and z are changed in the respective ranges. Furthermore, also those further containing a group V element other than N (nitrogen), those further containing various elements added in order to control various properties such as the conductivity type, and those further containing various elements unintentionally contained in the chemical formula mentioned above are included in the "nitride semiconductor."

Hereinabove, embodiments of the invention are described with reference to specific examples. However, the invention is not limited to these specific examples. For example, one skilled in the art may appropriately select specific configurations of components of semiconductor light emitting devices such as light emitting layers and semiconductor layers from known art and similarly practice the invention. Such practice is included in the scope of the invention to the extent that similar effects thereto are obtained.

Further, any two or more components of the specific examples may be combined within the extent of technical feasibility and are included in the scope of the embodiments to the extent that the spirit of the embodiments is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting element comprising:
   a first semiconductor layer of a first conductivity type containing a nitride semiconductor crystal;
   a second semiconductor layer of a second conductivity type containing a nitride semiconductor crystal; and
   a light emitting layer provided between the first semiconductor layer and the second semiconductor layer and including a well layer with a thickness of t1 (nanometers), the well layer including $In_xGa_{1-x}N$ having an In composition ratio x higher than 0 and lower than 1,
   the first semiconductor layer having a tensile strain of not less than 0.02 percent and not more than 0.25 percent in a plane perpendicular to a stacking direction from the first semiconductor layer toward the second semiconductor layer,
   the second semiconductor layer having a tensile strain in the plane,
   a lattice constant of the well layer being larger than a lattice constant of the first semiconductor layer and larger than a lattice constant of the second semiconductor layer,
   a peak wavelength λp (nanometers) of light emitted from the light emitting layer satisfying a relationship of $$\lambda p = a1 + a2 \times (x + (t1 - 3.0) \times a3),$$

the a1 being not less than 359 and not more than 363,
   the a2 being not less than 534 and not more than 550,
   the a3 being not less than 0.0205 and not more than 0.0235.

2. The element according to claim 1, wherein the first semiconductor layer has a tensile strain of not less than 0.03 percent and not more than 0.25 percent in the plane.

3. The element according to claim 1, wherein the first semiconductor layer has a tensile strain of not less than 0.05 percent and not more than 0.25 percent in the plane.

4. The element according to claim 1, wherein the first semiconductor layer has a tensile strain of not less than 0.02 percent and not more than 0.2 percent in the plane.

5. The element according to claim 1, wherein the first semiconductor layer has a tensile strain of not less than 0.03 percent and not more than 0.2 percent in the plane.

6. The element according to claim 1, wherein the first semiconductor layer has a tensile strain of not less than 0.05 percent and not more than 0.2 percent in the plane.

7. The element according to claim 1, wherein an angle between a c-axis direction of the first semiconductor layer and the stacking direction is 5 degrees or less.

8. The element according to claim 1, wherein an angle between a c-axis direction of the first semiconductor layer and the plane is not less than 85 degrees and not more than 95 degrees.

9. The element according to claim 1, wherein the first semiconductor layer contains GaN.

10. The element according to claim 1, wherein the second semiconductor layer contains GaN.

11. The element according to claim 1, wherein a thickness of the well layer is 2.7 nanometers or less.

12. The element according to claim 1, wherein a thickness of the well layer is 3.0 nanometers or less.

13. The element according to claim 1, wherein the peak wavelength is not less than 430 nanometers and not more than 450 nanometers.

14. The element according to claim 1, wherein the peak wavelength is not less than 410 nanometers and not more than 470 nanometers.

15. The element according to claim 1, wherein the In composition ratio of the well layer is 0.2 or less.

16. The element according to claim 1, wherein a dislocation density in the first semiconductor layer is $1.5 \times 10^9$ cm$^{-2}$ or less.

17. The element according to claim 1, wherein
the light emitting layer further includes a plurality of barrier layers,
the well layer is provided in plural,
a plurality of well layers and the plurality of barrier layers are alternately arranged,
a number of the plurality of well layers is 4 or more, and
a number of the plurality of barrier layers is 4 or more.

18. The element according to claim 17, wherein the plurality of barrier layers contain GaN.

19. The element according to claim 17, wherein a thickness of the barrier layer is not less than 1.0 nanometer and not more than 5.0 nanometers.

20. A semiconductor light emitting element comprising:
a first semiconductor layer of a first conductivity type containing a nitride semiconductor crystal in which a lattice length is longer than a lattice constant;
a second semiconductor layer of a second conductivity type containing a nitride semiconductor crystal in which a lattice length is longer than a lattice constant; and
a light emitting layer provided between the first semiconductor layer and the second semiconductor layer and including a well layer with a thickness of t1 (nanometers) in which a lattice length is shorter than a lattice constant, the well layer including $In_xGa_{1-x}N$ having an In composition ratio x of higher than 0 and lower than 1, the light emitting layer being configured to emit a prescribed peak wavelength λp,
at least one of the thickness of t1 being smaller than a thickness of the well layer in which a lattice length is substantially equal to a lattice constant and the In composition ratio x being lower than an In composition ratio of the well layer in which a lattice length is substantially equal to a lattice constant being satisfied when the light emitting layer is configured so as to obtain a peak wavelength substantially equal to the prescribed peak wavelength λp.

* * * * *